US011977140B2

United States Patent
Liu et al.

(10) Patent No.: US 11,977,140 B2
(45) Date of Patent: May 7, 2024

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Hui Liu, Houston, TX (US); Qi Liu, Houston, TX (US); Yichen Hu, Houston, TX (US)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 17/807,855

(22) Filed: Jun. 20, 2022

(65) Prior Publication Data

US 2022/0326326 A1 Oct. 13, 2022

Related U.S. Application Data

(63) Continuation of application No. 17/033,001, filed on Sep. 25, 2020, now Pat. No. 11,366,189.

(51) Int. Cl.
*G01V 3/00* (2006.01)
*G01R 33/24* (2006.01)
(Continued)

(52) U.S. Cl.
CPC .......... *G01R 33/485* (2013.01); *G01R 33/243* (2013.01); *G01R 33/4828* (2013.01); *G01R 33/5616* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

| 5,615,676 A | 4/1997 | Kohno |
| 7,405,196 B2 | 7/2008 | Rosskamp et al. |

(Continued)

FOREIGN PATENT DOCUMENTS

| CN | 104603629 A | * | 5/2015 | ........... G01R 33/385 |
| CN | 104997511 A | | 10/2015 | |

(Continued)

OTHER PUBLICATIONS

Wu, Renhua et al., Quantitative Description of Radiofrequency(RF) Power-Based Ratiometric Chemical Exchange Saturation Transfer(C-EST) PH Imaging, NMR in Biomedicine, 2015, 22 pages.
(Continued)

*Primary Examiner* — Walter L Lindsay, Jr.
*Assistant Examiner* — Frederick Wenderoth
(74) *Attorney, Agent, or Firm* — METIS IP LLC

(57) ABSTRACT

The present disclosure provides a system for MRI. The system may obtain a plurality of echo signals relating to a subject that are excited by an MRI pulse sequence applied to the subject. The system may perform a quantitative measurement on the subject based on the plurality of echo signals. The MRI pulse sequence may include a CEST module configured to selectively excite exchangeable protons or exchangeable molecules in the subject, an RF excitation pulse applied after the CEST module configured to excite a plurality of gradient echoes, and one or more refocusing pulses applied after the RF excitation pulse. Each of the refocusing pulses may be configured to excite one or more spin echoes. The one or more spin echoes excited by at least one of the one or more refocusing pulses may include a symmetric spin echo and one or more asymmetric spin echoes.

20 Claims, 15 Drawing Sheets

(51) Int. Cl.
*G01R 33/48* (2006.01)
*G01R 33/485* (2006.01)
*G01R 33/561* (2006.01)

(58) Field of Classification Search
USPC .......................................................... 324/309
See application file for complete search history.

(56) References Cited

U.S. PATENT DOCUMENTS

| | | | |
|---|---|---|---|
| 9,766,313 B2 * | 9/2017 | Eggers | ............... G01R 33/5605 |
| 2011/0241672 A1 | 10/2011 | King et al. | |
| 2011/0288402 A1 | 11/2011 | Pikkemaat et al. | |
| 2013/0009640 A1 | 1/2013 | Fautz et al. | |
| 2014/0039297 A1 | 2/2014 | Keupp | |
| 2014/0070803 A1 | 3/2014 | Jin et al. | |
| 2014/0300353 A1 | 10/2014 | He | |
| 2015/0051474 A1 | 2/2015 | Eggers et al. | |
| 2015/0153432 A1 | 6/2015 | James et al. | |
| 2015/0338483 A1 | 11/2015 | Sun | |
| 2015/0355298 A1 | 12/2015 | Ben-Eliezer et al. | |
| 2016/0018496 A1 | 1/2016 | Van Zijl et al. | |
| 2016/0061921 A1 | 3/2016 | Katscher et al. | |
| 2016/0084929 A1 | 3/2016 | Dale et al. | |
| 2016/0223634 A1 | 8/2016 | Yang | |
| 2017/0242087 A1 | 8/2017 | Zho | |
| 2018/0164393 A1 | 6/2018 | Ellingson et al. | |
| 2018/0177898 A1 | 6/2018 | Navon et al. | |
| 2020/0158803 A1 | 5/2020 | Harris et al. | |
| 2020/0191894 A1 | 6/2020 | Carinci et al. | |
| 2021/0063519 A1 | 3/2021 | Keupp | |
| 2021/0373100 A1 | 12/2021 | Zhang et al. | |

FOREIGN PATENT DOCUMENTS

| | | | | |
|---|---|---|---|---|
| CN | 110824398 A | | 2/2020 | |
| EP | 3511726 A1 | * | 7/2019 | ............ G01R 33/243 |
| EP | 3394627 B1 | | 6/2020 | |
| WO | WO-2012117350 A1 | * | 9/2012 | ............. G01R 33/32 |
| WO | WO-2013040086 A1 | * | 3/2013 | ............ A61B 5/0042 |
| WO | WO-2014008315 A1 | * | 1/2014 | ......... G01R 33/4818 |
| WO | WO-2017214439 A1 | * | 12/2017 | ............. A61B 5/055 |

OTHER PUBLICATIONS

Kenneth P. Whittall et al., Quantitative Interpretation of NMR Relaxation Data, Journal of Magnetic Resonance, 84: 134-152, 1989.

Heiko Schmiedeskamp et al., Combined Spin- and Gradient-Echo Perfusion-Weighted Imaging, Magnetic Resonance in Medicine, 2011, 11 pages.

Robert J. Harris et al., Simultaneous pH-sensitive and Oxygen-sensitive MRI of Human Gliomas at 3 T Using Multi-Echo Amine Proton Chemical Exchange Saturation Transfer Spin-and-Gradient Echo Echo-planar Imaging (CEST-SAGE-EPI), Magnetic Resonance in Medicine, 2018, 17 pages.

Eva Alonso-Ortiz et al., MRI-Based Myelin Water Imaging: A Technical Review, Magnetic Resonance in Medicine, 73(1): 70-81, 2015.

Alex L. Mackay et al., Magnetic Resonance of Myelin Water: An in vivo Marker for Myelin, Brain Plasticity, 2: 71-91, 2016.

B. Wu et al., An Overview of CEST MRI for Non-MR Physicists, EJNMMI Physics, 2016, 21 pages.

Seth A. Smith et al., Direct Saturation MRI: Theory and Application to Imaging Brain Iron, Magnetic Resonance in Medicine, 2009, 19 pages.

David A. Reiter et al., Multicomponent T2 Relaxation Analysis in Cartilage, Magnetic Resonance in Medicine, 2009, 15 pages.

Peter C. M. Van Zijl et al., Chemical Exchange Saturation Transfer(C-EST): What is in a Name and What isn't?, Magnetic Resonance in Medicine, 65: 927-948, 2011.

Thomas Prasloski et al., Rapid Whole Cerebrum Myelin Water Imaging Using a 3D GRASE Sequence, NeuroImage, 63(1): 533-539, 2012.

Chunmiao Wu et al., Research Progress of CEST Agent in MR Imaging, International Journal of Medical Radiology, 2009, 4 pages.

Quan Tao et al., pH Imaging Based on Chemical Exchange Saturation Transfer: Principles, Methods, Applications and Recent Progresses, Chinese Journal of Magnetic Resonance, 35(4): 505-519, 2018.

Heiko Schmiedeskamp et al., Compensation of Slice Profile Mismatch in Combined Spin- and Gradient-Echo EPI Pulse Sequences, Magnetic Resonance in Medicine, 2012, 18 pages.

* cited by examiner

600

Obtaining a plurality of echo signals relating to a subject, the plurality of echo signals being excited by an MRI pulse sequence applied to the subject — 601

Performing a quantitative measurement on the subject based on the plurality of echo signals — 602

FIG. 6

SYSTEMS AND METHODS FOR MAGNETIC RESONANCE IMAGING

CROSS-REFERENCE TO RELATED APPLICATIONS

This application is a continuation of U.S. patent application Ser. No. 17/033,001, filed on Sep. 25, 2020, the contents of which are hereby incorporated by reference.

TECHNICAL FIELD

The present disclosure generally relates to magnetic resonance imaging (MRI), and more particularly, relates to systems and methods for performing a quantitative measurement on a subject using MRI techniques.

BACKGROUND

MRI systems are widely used in disease diagnosis and/or treatment. Recently, chemical exchange saturation transfer (CEST) MRI has been developed and used to perform various measurements (e.g., a longitudinal relaxation time (T1) measurement, a transverse relaxation time (T2) measurement, an amide proton transfer (APT) measurement, a myelin water fraction (MWF) measurement, a pH measurement) on a subject to provide a basis for the disease diagnosis and/or treatment.

SUMMARY

According to one aspect of the present disclosure, a system for MRI is provided. The system may include at least one storage device including a set of instructions, and at least one processor configured to communicate with the at least one storage device. When executing the instructions, the at least one processor may be configured to direct the system to perform the following operations. The at least one processor may be configured to direct the system to obtain a plurality of echo signals relating to a subject. The plurality of echo signals may be excited by an MRI pulse sequence applied to the subject. The at least one processor may be configured to direct the system to perform a quantitative measurement on the subject based on the plurality of echo signals. The MRI pulse sequence may include a CEST module, a radio frequency (RF) excitation pulse applied after the CEST module, and one or more refocusing pulses applied after the RF excitation pulse. The CEST module may be configured to selectively excite exchangeable protons or exchangeable molecules in the subject. The RF excitation pulse may be configured to configured to excite a plurality of gradient echoes. Each of the one or more refocusing pulses may be configured to excite one or more spin echoes. The one or more spin echoes excited by at least one of the one or more refocusing pulses may include a symmetric spin echo and one or more asymmetric spin echoes.

In some embodiments, the one or more refocusing pulses may include at least three refocusing pulses.

In some embodiments, the one or more spin echoes excited by each of the at least three refocusing pulses comprise a symmetric spin echo. The performing a quantitative measurement on the subject based on the plurality of echo signals may include determining an MWF relating to the subject based on the symmetric spin echoes excited by the at least three refocusing pulses.

In some embodiments, the performing a quantitative measurement on the subject based on the plurality of echo signals may include determining an R2 value and an R2* value relating to the subject based on the plurality of gradient echoes, the one or more asymmetric spin echoes excited by the at least one refocusing pulse, and the symmetric spin echo excited by the at least one refocusing pulse.

In some embodiments, the at least one processor may be configured to direct the system to determine an R2' value relating to the subject based on the R2 value and the R2* value.

In some embodiments, the at least one processor may be configured to direct the system to determine a coefficient that measures a difference between a slice profile corresponding to the RF excitation pulse and a slice profile corresponding to the at least one refocusing pulse based on the plurality of gradient echoes, the one or more asymmetric spin echoes excited by the at least one refocusing pulse, and the symmetric spin echo excited by the at least one refocusing pulse.

In some embodiments, the plurality of gradient echoes may be R2*-weighted gradient echoes. The one or more asymmetric spin echoes excited by the at least one refocusing pulse may be R2- and R2*-weighted spin echoes. The symmetric spin-echo excited by the at least one refocusing pulse may be an R2-weighted spin echo.

In some embodiments, the MRI pulse sequence may further include a fat suppression module applied between the CEST module and the RF excitation pulse configured to suppress signals from an adipose tissue of the subject.

In some embodiments, the MRI pulse sequence may be applied to the subject for multiple times with different saturation frequencies of the CEST module in a plurality of acquisitions. The plurality of echo signals may include a plurality of sets of echo signals each of which are acquired in one of the plurality of acquisitions. The performing a quantitative measurement on the subject based on the plurality of echo signals may include performing a magnetization transfer asymmetry (MTRasym) analysis on the plurality of sets of echo signals.

In some embodiments, the performing a quantitative measurement on the subject based on the plurality of echo signals further may include determining a pH value relating to the subject based on a result of the MTRasym analysis.

In some embodiments, the at least one processor may be further configured to direct the system to generate a B0 map based on the plurality of echo signals.

According to another aspect of the present disclosure, a method for MRI is provided. The method may include obtaining a plurality of echo signals relating to a subject and performing a quantitative measurement on the subject based on the plurality of echo signals. The plurality of echo signals may be excited by an MRI pulse sequence applied to the subject. The method may also include performing a quantitative measurement on the subject based on the plurality of echo signals. The MRI pulse sequence may include a CEST module, an RF excitation pulse applied after the CEST module, and one or more refocusing pulses applied after the RF excitation pulse. The CEST module may be configured to selectively excite exchangeable protons or exchangeable molecules in the subject. The RF excitation pulse may be configured to configured to excite a plurality of gradient echoes. Each of the one or more refocusing pulses may be configured to excite one or more spin echoes. The one or more spin echoes excited by at least one of the one or more refocusing pulses may include a symmetric spin echo and one or more asymmetric spin echoes.

According to another aspect of the present disclosure, a non-transitory readable medium including at least one set of instructions for MRI is provided. When accessed by at least one processor, the at least one set of instructions may direct the at least one processor to perform a method. The method may include obtaining a plurality of echo signals relating to a subject and performing a quantitative measurement on the subject based on the plurality of echo signals. The plurality of echo signals may be excited by an MRI pulse sequence applied to the subject. The method may also include performing a quantitative measurement on the subject based on the plurality of echo signals. The MRI pulse sequence may include a CEST module, an RF excitation pulse applied after the CEST module, and one or more refocusing pulses applied after the RF excitation pulse. The CEST module may be configured to selectively excite exchangeable protons or exchangeable molecules in the subject. The RF excitation pulse may be configured to configured to excite a plurality of gradient echoes. Each of the one or more refocusing pulses may be configured to excite one or more spin echoes. The one or more spin echoes excited by at least one of the one or more refocusing pulses may include a symmetric spin echo and one or more asymmetric spin echoes.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 6 is a flowchart illustrating an exemplary process for performing a quantitative measurement on a subject according to some embodiments of the present disclosure;

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

Figure 3:
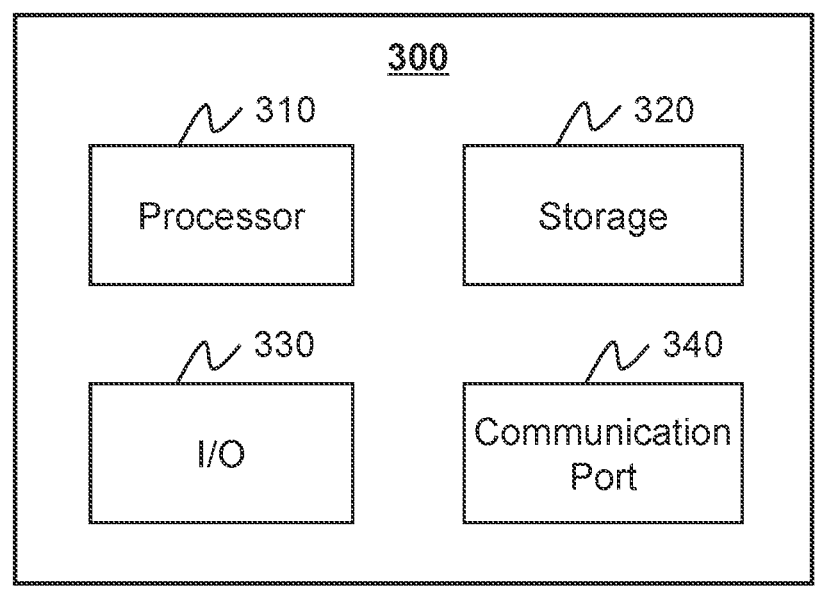
FIG. 3 is a schematic diagram illustrating exemplary hardware and/or software components of a computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 310 as illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items. The term "image" in the present disclosure is used to collectively refer to image data (e.g., scan data, projection data) and/or images of various forms, including a two-dimensional (2D) image, a three-dimensional (3D) image, a four-dimensional (4D) image, etc. The term "pixel" and "voxel" in the present disclosure are used interchangeably to refer to an element of an image.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and methods for non-invasive biomedical imaging, such as for disease diagnostic or research purposes. While the systems and methods disclosed in the present disclosure are described primarily regarding an MRI system. It should be understood that this is only for illustration purposes. The systems and methods of the present disclosure may be applied to any other kind of imaging system. In some embodiments, the imaging system may include a single modality imaging system and/or a multi-modality imaging system. The single modality imaging system may include, for example, the MRI system. The multi-modality imaging system may include, for example, an X-ray imaging-magnetic resonance imaging (X-ray-MRI) system, a single photon emission computed tomography-magnetic resonance imaging (SPECT-MRI) system, a digital subtraction angiography-magnetic resonance imaging (DSA-MRI) system, a computed tomography-magnetic resonance imaging (MRI-CT) system, a positron emission tomography-magnetic resonance imaging (PET-MRI) system, etc.

CEST imaging is a magnetic resonance imaging contrast approach in which exogenous or endogenous compounds including either exchangeable protons or exchangeable molecules are selectively saturated and after the transfer of this saturation, detected indirectly through a water signal with enhanced sensitivity. CEST imaging has been used to produce various quantitative results of a subject (e.g., a patient or a portion thereof). For example, CEST imaging may be used to acquire an APT weighted image, a pH weighted image, a signal decay rate (R2) map, a transverse relaxation rate (R2*) map, a reversible transverse relaxation rate (R2') map, an MWF map, a B0 map, or the like, or any combination thereof, of the subject. Conventionally, information relating to different quantitative parameters may need to be acquired separately by applying different CEST pulse sequences to the subject. For example, information relating to APT and pH of the subject may be obtained by applying a first MRI pulse to the subject, and information relating to R2, R2*, R2', and MWF may be obtained by applying a second MRI pulse different from the first MRI pulse to the subject. This may waste time and human sources, and reduce the efficiency of CEST imaging and disease diagnosis performed based thereon.

In order to improve the efficiency of CEST imaging, an aspect of the present disclosure provides systems and methods that can be used to simultaneously acquire information relating to a plurality of quantitative parameters of the subject. The systems may obtain a plurality of echo signals relating to a subject. The plurality of echo signals may be excited by an MRI pulse sequence applied to the subject. The MRI system may perform a quantitative measurement on the subject based on the plurality of echo signals. For example, the quantitative measurement may involve determining a plurality of quantitative parameters, such as an R2 value, an R2* value, an R2' value, an MWF, an APT, pH, a B0 value, or the like, or any combination thereof, relating to the subject.

The MRI pulse sequence may have a specially designed configuration that enables simultaneous acquisition of the plurality of quantitative parameters. Merely by way of example, the MRI pulse sequence may include a CEST module configured to selectively excite exchangeable protons or exchangeable molecules in the subject. The MRI pulse sequence may also include an RF excitation pulse applied after the CEST module configured to excite a plurality of gradient echoes. The MRI pulse sequence may further include one or more refocusing pulses applied after the RF excitation pulse. Each of the one or more refocusing pulses may be configured to excite one or more spin echoes. The one or more spin echoes excited by at least one of the one or more refocusing pulses may include a symmetric spin echo and one or more asymmetric spin echoes. By applying the MRI pulse sequence with the specially designed configuration, more information relating to the subject may be acquired through one acquisition to achieve the quantitative measurement relating to multiple quantitative parameters. In this way, the systems disclosed in the present disclosure may improve the accuracy of the disease diagnosis (e.g., by providing multidimensional information) and the efficiency of MRI (e.g., by reducing a scanning time of the subject).

Figure 1:
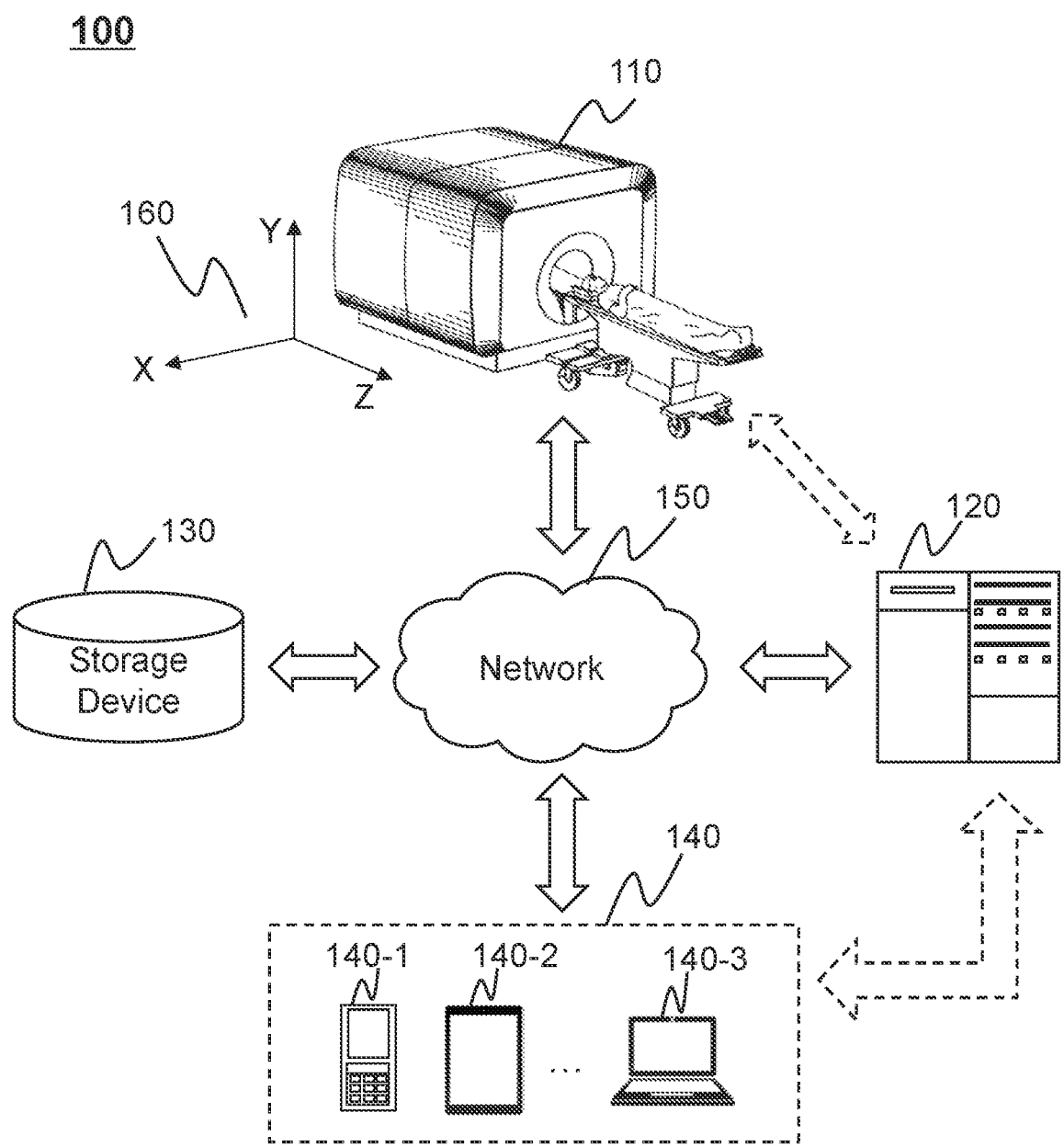
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. As shown in FIG. 1, the MRI system 100 may include an MR scanner 110 (or referred to as an MRI scanner), a processing device 120, a storage device 130, one or more terminals 140, and a network 150. In some embodiments, the MR scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MR scanner 110 may be connected to the processing device 120 through the network 150. As another example, the MR scanner 110 may be connected to the processing device 120 directly.

The MR scanner 110 may be configured to scan a subject (or a part of the subject) to acquire image data, such as echo signals (or MR signals) associated with the subject. For example, the MR scanner 110 may detect a plurality of echo signals by applying an MR pulse sequence on the subject. In some embodiments, the MR scanner 110 may include, for example, a main magnet, a gradient coil (or also referred to a spatial encoding coil), a radio frequency (RF) coil, etc., as described in connection with FIG. 2. In some embodiments, the MR scanner 110 may be a permanent magnet MR scanner, a superconducting electromagnet MR scanner, or a resistive electromagnet MR scanner, etc., according to types of the main magnet. In some embodiments, the MR scanner 110 may be a high-field MR scanner, a mid-field MR scanner, and a low-field MR scanner, etc., according to the intensity of the magnetic field.

The subject scanned by the MR scanner 110 may be biological or non-biological. For example, the subject may include a patient, a man-made object, etc. As another example, the subject may include a specific portion, organ, tissue, and/or a physical point of the patient. Merely by way of example, the subject may include head, brain, neck, body, shoulder, arm, thorax, cardiac, stomach, blood vessel, soft tissue, knee, feet, or the like, or a combination thereof.

For illustration purposes, a coordinate system 160 including an X-axis, a Y-axis, and a Z-axis is provided in FIG. 1. The X-axis and the Z-axis shown in FIG. 1 may be horizontal, and the Y-axis may be vertical. As illustrated, the positive X direction along the X-axis may be from the right side to the left side of the MR scanner 110 seen from the direction facing the front of the MR scanner 110; the positive Y direction along the Y-axis shown in FIG. 1 may be from the lower part to the upper part of the MR scanner 110; the positive Z direction along the Z-axis shown in FIG. 1 may refer to a direction in which the subject is moved out of the scanning channel (or referred to as the bore) of the MR scanner 110. More description of the MR scanner 110 may be found elsewhere in the present disclosure. See, e.g., FIG. 2 and the description thereof.

The processing device 120 may process data and/or information obtained from the MR scanner 110, the storage device 130, and/or the terminal(s) 140. For example, the MR scanner 110 may excite a plurality of echo signals relating to the subject by scanning the subject. The processing device 120 may obtain the echo signals from the MR scanner 110, and perform a quantitative measurement on the subject based on the echo signals. In some embodiments, the processing device 120 may be a single server or a server group. The server group may be centralized or distributed. In some embodiments, the processing device 120 may be local or remote. For example, the processing device 120 may access information and/or data from the MR scanner 110, the storage device 130, and/or the terminal(s) 140 via the network 150. As another example, the processing device 120 may be directly connected to the MR scanner 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be implemented by a computing device 300 having one or more components as described in connection with FIG. 3.

The storage device 130 may store data, instructions, and/or any other information. In some embodiments, the storage device 130 may store data obtained from the MR scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or a combination thereof. Exemplary mass storage devices may include a magnetic disk, an optical disk, a solid-state drive, etc. Exemplary removable storage devices may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), a digital versatile disk ROM, etc. In some embodiments, the storage device 130 may be implemented on a cloud platform as described elsewhere in the disclosure.

In some embodiments, the storage device 130 may be connected to the network 150 to communicate with one or more other components in the MRI system 100 (e.g., the MR scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable a user interaction between a user and the MRI system 100. For example, the terminal(s) 140 may receive an instruction to cause the MR scanner 110 to scan the subject from the user. As another example, the terminal(s) 140 may receive a processing result (e.g., an R2 map and an R2* map relating to the subject) from the processing device 120 and display the processing result to the user. In some embodiments, the terminal(s) 140 may be connected to and/or communicate with the MR scanner 110, the processing device 120, and/or the storage device 130. In some embodiments, the terminal(s) 140 may include a mobile device 140-1, a tablet computer 140-2, a laptop computer 140-3, or the like, or a combination thereof. For example, the mobile device 140-1 may include a mobile phone, a personal digital assistant (PDA), a gaming device, a navigation device, a point of sale (POS) device, a laptop, a tablet computer, a desktop, or the like, or a combination thereof. In some embodiments, the terminal(s) 140 may include an input device, an output device, etc. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to the processing device 120 via, for example, a bus, for further processing. Other types of the input device may include a cursor control device, such as a mouse, a trackball, or cursor direction keys, etc. The output device may include a display, a speaker, a printer, or the like, or a combination thereof. In some embodiments, the terminal(s) 140 may be part of the processing device 120 or the MR scanner 110.

The network 150 may include any suitable network that can facilitate the exchange of information and/or data for the MRI system 100. In some embodiments, one or more components of the MRI system 100 (e.g., the MR scanner 110, the processing device 120, the storage device 130, the terminal(s) 140, etc.) may communicate information and/or data with one or more other components of the MRI system 100 via the network 150. For example, the processing device 120 may obtain image data (e.g., an echo signal) from the MR scanner 110 via the network 150. As another example, the processing device 120 may obtain user instructions from the terminal(s) 140 via the network 150. The network 150 may include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, or the like, or a combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or a combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MR scanner 110. As another example, a component of the MRI system 100 may be replaced by another component that can implement the functions of the component. In some embodiments, the storage device 130 may be a data storage including cloud computing platforms, such as a public cloud, a private cloud, a community and hybrid cloud, etc. However, those variations and modifications do not depart the scope of the present disclosure.

Figure 2:
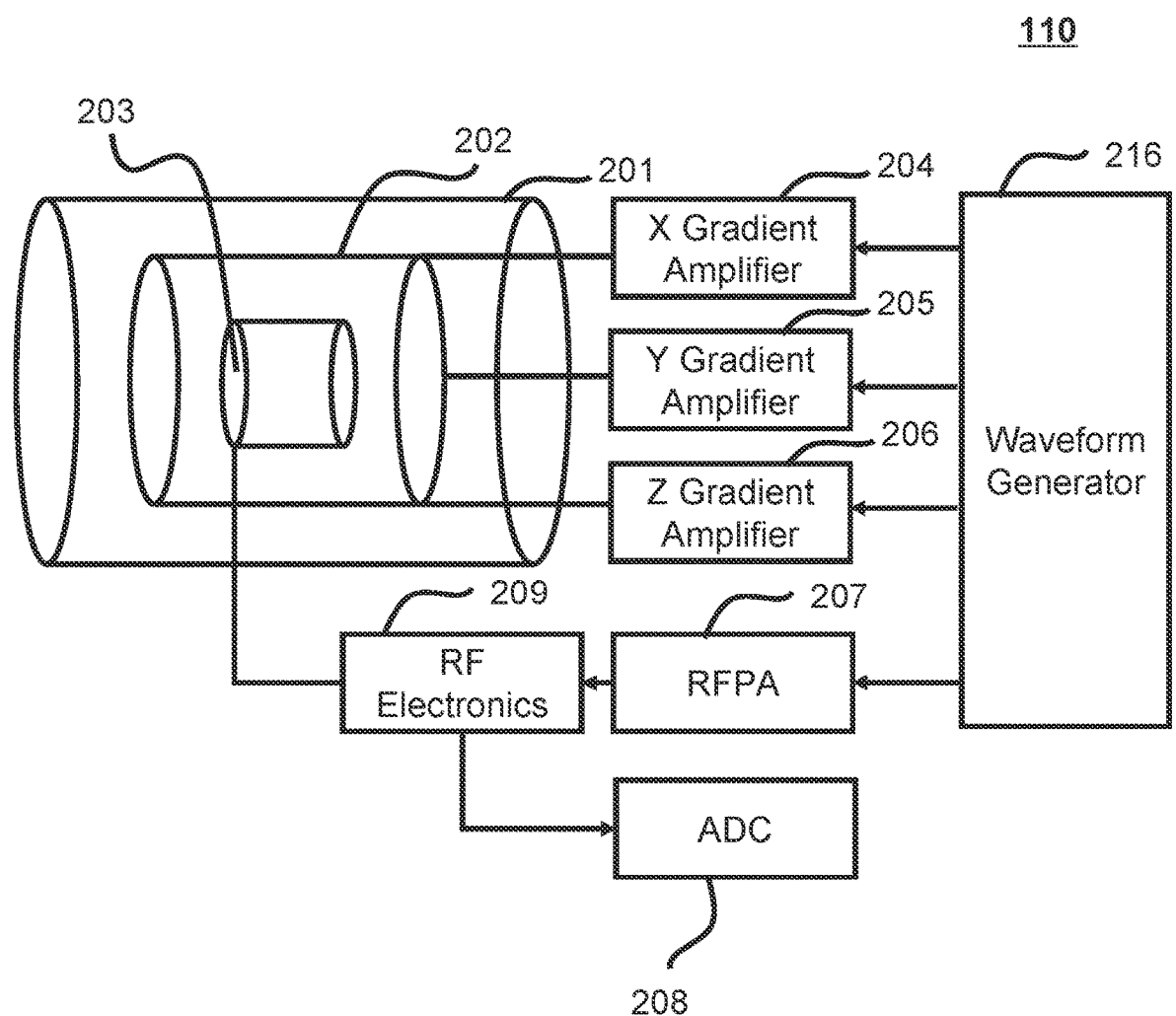
FIG. 2 is a schematic diagram illustrating an exemplary MR scanner according to some embodiments of the present disclosure.

FIG. 2 is a schematic diagram illustrating an exemplary MR scanner 110 according to some embodiments of the present disclosure. One or more components of the MR scanner 110 are illustrated in FIG. 2. As illustrated, main magnet 201 may generate a first magnetic field (or referred to as a main magnetic field) that may be applied to a subject exposed inside the field. The main magnet 201 may include a resistive magnet or a superconductive magnet that both need a power supply (not shown) for operation. Alternatively, the main magnet 201 may include a permanent magnet. The main magnet 201 may include a bore that the subject is placed within. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. The gradient coils 202 may generate a second magnetic field (or referred to as a gradient field, including gradient fields Gx, Gy, and Gz). The second magnetic field may be superimposed on the main field generated by the main magnet 201 and distort the main field so that the magnetic orientations of the protons of a subject may vary as a function of their positions inside the gradient field, thereby encoding spatial information into echo signals generated by the region of the subject being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of echo signals for image construction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MR scanner or an open-bore MR scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate echo signals related to the region of the subject being imaged. The third magnetic field may be perpendicular to the main magnetic field. The waveform generator 216 may generate an RF excitation pulse. The RF excitation pulse may be amplified by the RFPA 207, processed by the RF electronics 209, and applied to the RF coils 203 to generate the RF signals in response to a powerful current generated by the RF electronics 209 based on the amplified RF excitation pulse.

When used as receivers, the RF coils may be responsible for detecting echo signals. After excitation, the echo signals generated by the subject may be sensed by the RF coils 203. The receive amplifier then may receive the sensed echo signals from the RF coils 203, amplify the sensed echo signals, and provide the amplified echo signals to the ADC 208. The ADC 208 may transform the echo signals from analog signals to digital signals. The digital echo signals then may be sent to the processing device 120 for sampling.

In some embodiments, the gradient coils 202 and the RF coils 203 may be circumferentially positioned with respect to the subject. It is understood by those skilled in the art that the main magnet 201, the gradient coils 202, and the RF coils 203 may be situated in a variety of configurations around the subject.

In some embodiments, the RFPA 207 may amplify an RF excitation pulse (e.g., the power of the RF excitation pulse, the voltage of the RF excitation pulse) such that an amplified RF excitation pulse is generated to drive the RF coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MR scanner 110 may further include a subject positioning system (not shown). The subject positioning system may include a subject cradle and a transport device. The subject may be placed on the subject cradle and be positioned by the transport device within the bore of the main magnet 201.

MRI systems (e.g., the MRI system 100 disclosed in the present disclosure) may be commonly used to obtain an interior image from a patient for a particular region of interest (ROI) that can be used for the purposes of, e.g., diagnosis, treatment, or the like, or a combination thereof. MRI systems include a main magnet (e.g., the main magnet 201) assembly for providing a strong uniform main magnetic field to align the individual magnetic moments of the H atoms within the patient's body. During this process, the H atoms oscillate around their magnetic poles at their characteristic Larmor frequency. If the tissue is subjected to an additional magnetic field, which is tuned to the Larmor frequency, the H atoms absorb additional energy, which rotates the net aligned moment of the H atoms. The additional magnetic field may be provided by an RF excitation signal (e.g., the RF signal generated by the RF coils 203). When the additional magnetic field is removed, the magnetic moments of the H atoms rotate back into alignment with the main magnetic field thereby emitting an echo signal. The echo signal is received and processed to form an MR image. T1 relaxation may be the process by which the net magnetization grows/returns to its initial maximum value parallel to the main magnetic field. T1 may be the time constant for regrowth of longitudinal magnetization (e.g., along the main magnetic field). T2 relaxation may be the process by which the transverse components of magnetization decay or dephase. T2 may be the time constant for decay/dephasing of transverse magnetization.

If the main magnetic field is uniform across the entire body of the patient, then the RF excitation signal may excite all of the H atoms in the sample non-selectively. Accordingly, in order to image a particular portion of the patient's body, magnetic field gradients Gx, Gy, and Gz (e.g., generated by the gradient coils 202) in the x, y, and z directions, having a particular timing, frequency, and phase, may be superimposed on the uniform magnetic field such that the RF excitation signal excites the H atoms in a desired slice of the patient's body, and unique phase and frequency information is encoded in the echo signal depending on the location of the H atoms in the "image slice."

Typically, portions of the patient's body to be imaged are scanned by a sequence of measurement cycles in which the RF excitation signals and the magnetic field gradients Gx, Gy and Gz vary according to an MRI imaging protocol that is being used. A protocol may be designed for one or more tissues to be imaged, diseases, and/or clinical scenarios. A protocol may include a certain number of pulse sequences oriented in different planes and/or with different parameters. The pulse sequences may include spin echo sequences, gradient echo sequences, diffusion sequences, inversion recovery sequences, or the like, or any combination thereof. For instance, the spin echo sequences may include a fast spin echo (FSE) pulse sequence, a turbo spin echo (TSE) pulse sequence, a rapid acquisition with relaxation enhancement (RARE) pulse sequence, a half-Fourier acquisition single-shot turbo spin-echo (HASTE) pulse sequence, a turbo gradient spin echo (TGSE) pulse sequence, or the like, or any combination thereof. As another example, the gradient echo sequences may include a balanced steady-state free precession (bSSFP) pulse sequence, a spoiled gradient echo (GRE) pulse sequence, and an echo planar imaging (EPI) pulse sequence, a steady state free precession (SSFP), or the like, or any combination thereof. The protocol may also include information regarding image contrast and/or ratio, an ROI, slice thickness, an imaging type (e.g., T1 weighted imaging, T2 weighted imaging, proton density weighted imaging, etc.), T1, T2, an echo type (spin echo, fast spin echo (FSE), fast recovery FSE, single shot FSE, gradient recalled echo, fast imaging with stead-state procession, and so on), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth, etc.), or the like, or any combination thereof. For each MRI scan, the resulting echo signals may be digitized and processed to reconstruct an image in accordance with the MRI imaging protocol that is used.

FIG. 3 is a schematic diagram illustrating exemplary hardware and/or software components of a computing device 300 according to some embodiments of the present disclosure. The computing device 300 may be used to implement any component of the MRI system 100 as described herein. For example, the processing device 120 and/or the terminal 140 may be implemented on the computing device 300, respectively, via its hardware, software program, firmware, or a combination thereof. Although only one such computing device is shown, for convenience, the computer functions relating to the MRI system 100 as described herein may be implemented in a distributed fashion on a number of similar platforms, to distribute the processing load. As illustrated in FIG. 3, the computing device 300 may include a processor 310, a storage 320, an input/output (I/O) 330, and a communication port 340.

The processor 310 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 310 may process image data obtained from the MR scanner 110, the terminal(s) 140, the storage device 130, and/or any other component of the MRI system 100. In some embodiments, the processor 310 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 300. However, it should be noted that the computing device 300 in the present disclosure may also include multiple processors, thus operations and/or method operations that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage 320 may store data/information obtained from the MR scanner 110, the terminal(s) 140, the storage device 130, and/or any other component of the MRI system 100. In some embodiments, the storage 320 may include a mass storage device, a removable storage device, a volatile read-and-write memory, a read-only memory (ROM), or the like, or any combination thereof. In some embodiments, the storage 320 may store one or more programs and/or instructions to perform exemplary methods described in the present disclosure. For example, the storage 320 may store a program for the processing device 120 to execute for CEST imaging.

The I/O 330 may input and/or output signals, data, information, etc. In some embodiments, the I/O 330 may enable a user interaction with the processing device 120. In some embodiments, the I/O 330 may include an input device and an output device. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to another component (e.g., the processing device 120) via, for example, a bus, for further processing. Other types of the input device may include a cursor control device, such as a mouse, a trackball, or cursor direction keys, etc. The output device may include a display (e.g., a liquid crystal display (LCD), a light-emitting diode (LED)-based display, a flat panel display, a curved screen, a television device, a cathode ray tube (CRT), a touch screen), a speaker, a printer, or the like, or a combination thereof.

The communication port 340 may be connected to a network (e.g., the network 150) to facilitate data communications. The communication port 340 may establish connections between the processing device 120 and the MR scanner 110, the terminal(s) 140, and/or the storage device 130. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee™ link, a mobile network link (e.g., 3G, 4G, 5G), or the like, or a combination thereof. In some embodiments, the communication port 340 may be and/or include a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
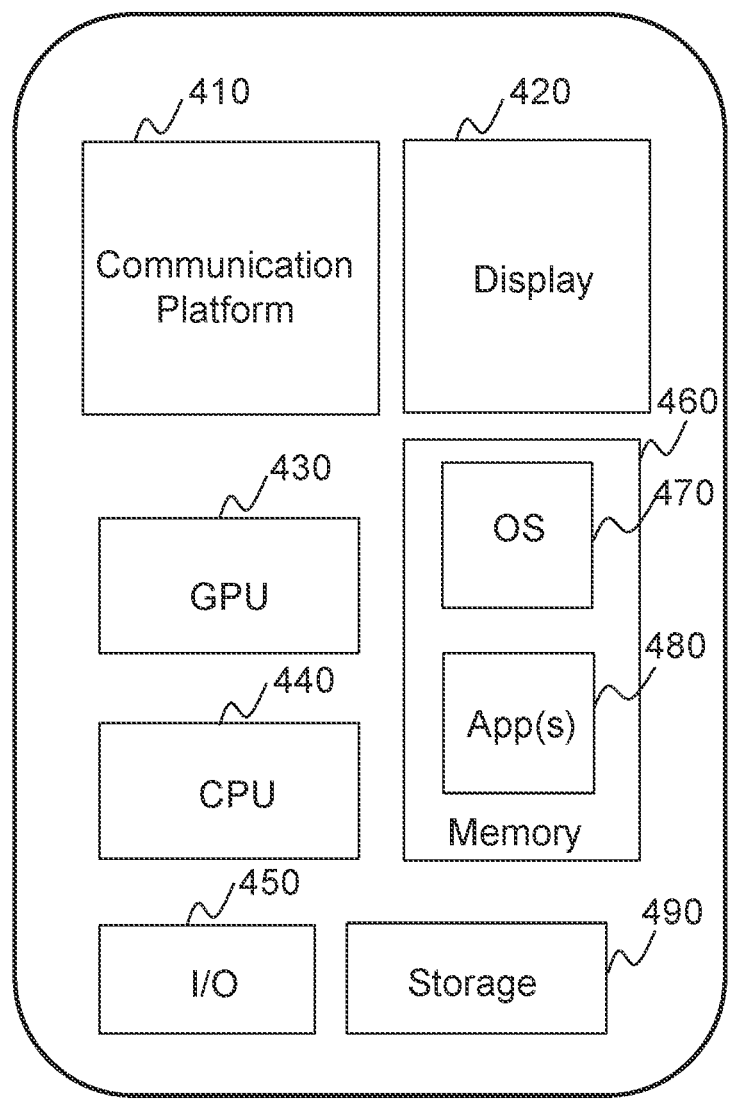
FIG. 4 is a schematic diagram illustrating exemplary hardware and/or software components of a mobile device according to some embodiments of the present disclosure.

FIG. 4 is a schematic diagram illustrating exemplary hardware and/or software components of a mobile device 400 according to some embodiments of the present disclosure. In some embodiments, one or more components (e.g., a terminal 140 and/or the processing device 120) of the MRI system 100 may be implemented on the mobile device 400.

As illustrated in FIG. 4, the mobile device 400 may include a communication platform 410, a display 420, a graphics processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS™, Android™, Windows Phone™) and one or more applications 480 may be loaded into the memory 460 from the storage 490 in order to be executed by the CPU 440. The applications 480 may include a browser or any other suitable mobile apps for receiving and rendering information relating to the MRI system 100. User interactions with the information stream may be achieved via the I/O 450 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 5:
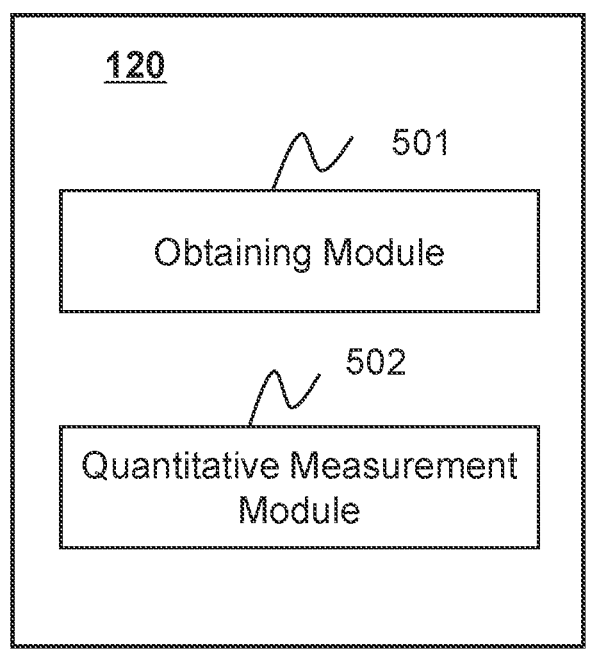
FIG. 5 is a block diagram illustrating an exemplary processing device according to some embodiments of the present disclosure.

FIG. 5 is a block diagram illustrating an exemplary processing device 120 according to some embodiments of the present disclosure. As shown in FIG. 5, the processing device 120 may include an obtaining module 501 and a quantitative measurement module 502.

The obtaining module 501 may be configured to obtain a plurality of echo signals relating to a subject (e.g., a patient). The plurality of echo signals may be excited by an MRI pulse sequence applied to the subject. In some embodiments, the MRI pulse sequence may include a CEST module, a fat suppression module, an RF excitation pulse, one or more refocusing pulses, or the like, or any combination thereof. The CEST module may be configured to selectively excite exchangeable protons or exchangeable molecules in the subject. The fat suppression module may be applied between the CEST module and the RF excitation pulse and configured to suppress signals from adipose tissue of the subject. The RF excitation pulse may be applied after the fat suppression module and configured to excite a plurality of gradient echoes. The refocusing pulses may be applied after the RF excitation pulse, wherein each refocusing pulse may be configured to excite one or more spin echoes. More descriptions regarding the obtaining of the echo signals may be found elsewhere in the present disclosure. See, e.g., operation 601 and relevant descriptions thereof.

The quantitative measurement module 502 may be configured to perform a quantitative measurement on the subject based on the plurality of echo signals. The quantitative measurement performed on the subject may include determining a quantitative parameter relating to the subject, generating a quantitative map of the subject, generating a specific image reflecting a physiological property of the subject, and/or any other measurement that can evaluate a characteristic of the subject. In some embodiments, the quantitative measurement module 502 may perform a quantitative measurement relating to a relaxation parameter (e.g., T1, T2, T2*, or T2'), MWF, APT, pH, and B0 of the subject. More descriptions regarding the quantitative measurement on the subject may be found elsewhere in the present disclosure. See, e.g., operation 602 and relevant descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 120 may include one or more additional modules, such as a storage module (not shown) for storing data. As another example, one or more modules of the processing device 120 described above may be omitted. Additionally or alternatively, two or more modules of the processing device 120 may be integrated into a single component. A module of the processing device 120 may be divided into two or more units.

FIG. 6 is a flowchart illustrating an exemplary process for performing a quantitative measurement on a subject according to some embodiments of the present disclosure. In some embodiments, process 600 may be executed by the MRI system 100. For example, the process 600 may be implemented as a set of instructions (e.g., an application) stored in a storage device (e.g., the storage device 130, the storage 320, and/or the storage 490). In some embodiments, the processing device 120 (e.g., the processor 310 of the computing device 300, the CPU 440 of the mobile device 400, and/or one or more modules illustrated in FIG. 5) may execute the set of instructions and may accordingly be directed to perform the process 600.

In some embodiments, the process 600 may be used to perform a quantitative measurement on a subject (e.g., a patient, a specific organ of the patient, a man-made object) using an MR scanner. The MR scanner may include one or more similar components to the MR scanner 110 as described in connection with FIGS. 1 and 2. For example, the MR scanner may include a main magnet, three sets of gradient coils, an RF coil, or the like, or any combination thereof. The three sets of gradient coils may be configured to generate magnetic gradient fields Gx, Gy, and Gz in the X direction, the Y direction, and the Z direction defined by the coordinate system 160, respectively.

In 601, the processing device 120 (e.g., the obtaining module 501) may obtain a plurality of echo signals relating to the subject.

The plurality of echo signals may be excited by an MRI pulse sequence applied to the subject. For example, the processing device 120 may cause the MR scanner to apply the MRI pulse sequence on the subject so as to acquire the echo signals, and the processing device 120 may obtain the echo signals from the MR scanner. As another example, the echo signals may be previously acquired and stored in a storage device (e.g., the storage device 130, the storage 320, an external storage device), and the processing device 120 may retrieve the echo signals from the storage device.

Figure 7:
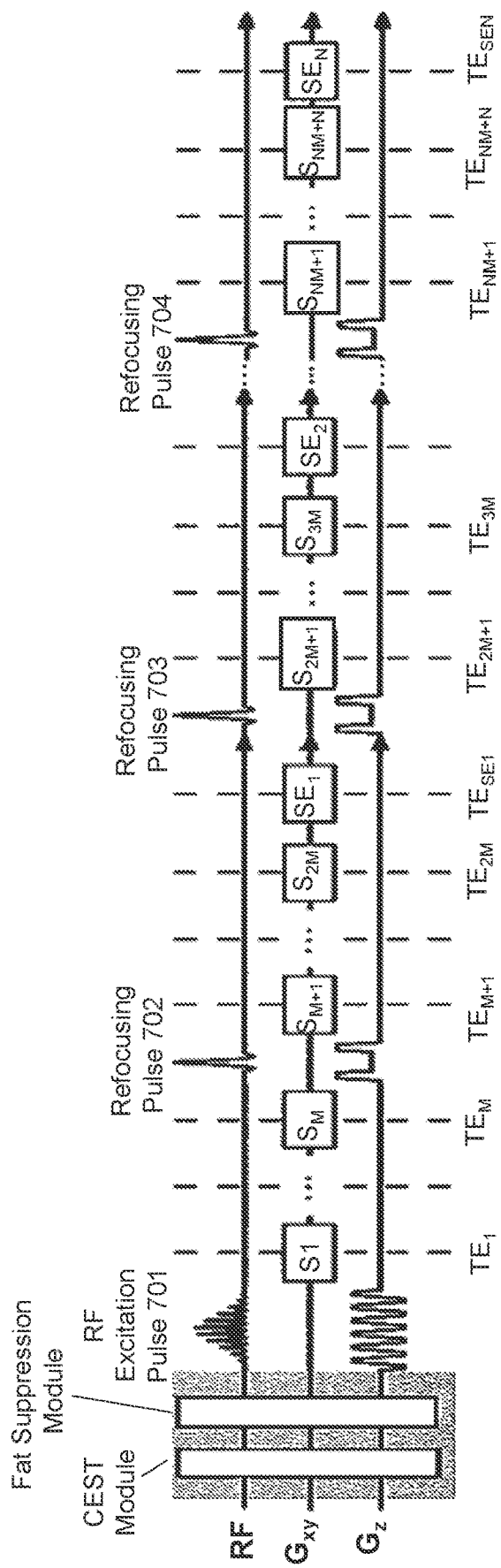
FIG. 7 is a schematic diagram illustrating an exemplary pulse sequence according to some embodiments of the present disclosure.

In some embodiments, the MRI pulse sequence may include a CEST module, a fat suppression module, an RF excitation pulse, one or more refocusing pulses, or the like, or any combination thereof. For illustration purposes, FIG. 7 illustrates an exemplary MRI pulse sequence 700 according to some embodiments of the present disclosure. As shown in FIG. 7, the MRI pulse sequence 700 may include a CEST module, a fat suppression module, an RF excitation pulse 701, and three or more refocusing pulses (e.g., refocusing pulses 702, 703, and 704).

Figure 8:
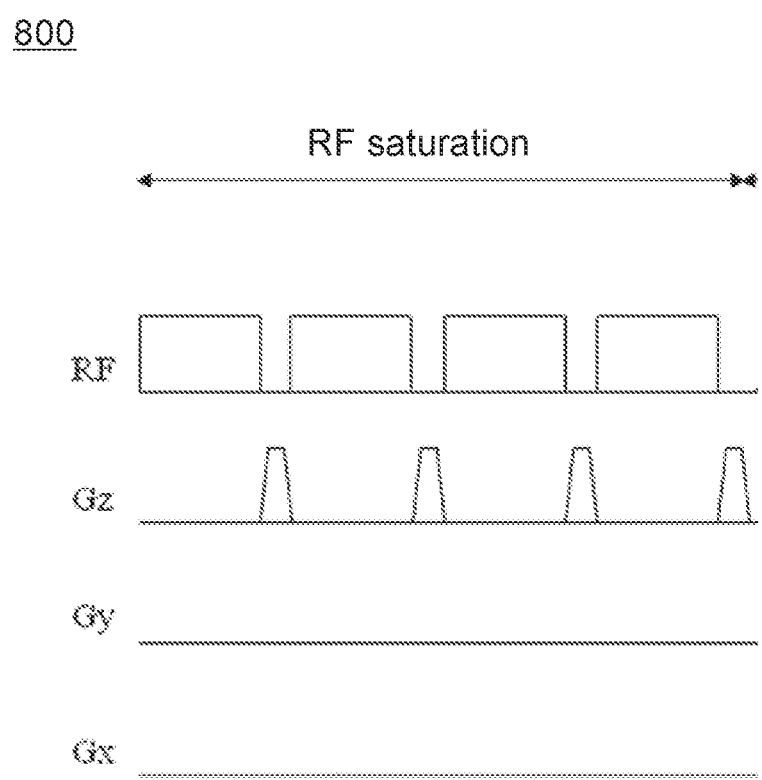
FIG. 8 is a schematic diagram illustrating an exemplary CEST module according to some embodiments of the present disclosure.

The CEST module may be configured to selectively excite exchangeable protons or exchangeable molecules in the subject. As described elsewhere in this disclosure, CEST imaging is a magnetic resonance imaging contrast approach in which exogenous or endogenous compounds containing exchangeable protons or exchangeable molecules are selectively saturated and after the transfer of this saturation, detected indirectly through a water signal with enhanced sensitivity. In MRI, saturation refers to a nonequilibrium state with no net magnetization. In some embodiments, an RF saturation pulse may be used to produce the saturation, for example, in a certain region or a set of regions of the subject. For example, the CEST module may include a plurality of off-resonance Gaussian pulses or square-wave pulses, wherein each Gaussian pulse or square-wave pulse may last several hundred milliseconds. For illustration purposes, FIG. 8 provides an exemplary CEST module 800 according to some embodiments of the present disclosure. As shown in FIG. 8, the CEST module 800 may include a train of RF saturation pulses and a plurality of spoiler gradients. Each of the RF saturation pulses may be followed by a spoiler gradient. The spoiler gradients may be used to reduce or minimize transverse magnetization.

The fat suppression module may be applied between the CEST module and the RF excitation pulse and configured to suppress signals from adipose tissue of the subject. For example, the fat suppression module may be implemented through a water excitation pulse (e.g., a spectral-spatial water-only excitation pulse). Since fat and water protons resonate at different frequencies, water protons may be selectively excited by a water excitation pulse. As another example, the fat suppression module may be implemented through a fat excitation pulse and a spoiler gradient, wherein the fat excitation pulse may be configured to selectively excite fat protons and the spoiler gradient may be configured to dephase fat signals.

The RF excitation pulse may be applied after the fat suppression module and configured to excite a plurality of gradient echoes. For example, the RF excitation pulse may include a 90° RF excitation pulse. The count of the gradient echoes may be equal to any positive integer greater than 1, such as 2, 3, 4, 5, or the like. For example, as shown in FIG. 7, M gradient echoes $S_1$ to $S_M$ excited by the RF excitation pulse may be sequentially acquired at $TE_1$ to $TE_M$, respectively. In some embodiments, the signal intensity of the plurality of gradient echoes may decay with a time constant T2*. The plurality of gradient echoes may be considered as T2*-weighted gradient echoes (or R2*-weighted gradient echoes). T2* may reflect an effect of a true T2 relaxation due to molecular mechanisms as well as accelerated signal loss due to a magnetic field inhomogeneity. As described in FIG. 2, the T2 relaxation may be the process by which transverse components of magnetization decay or dephase. It should be noted that, unless the context clearly indicates otherwise, T2 and R2 are used interchangeably, and T2* and R2* are used interchangeably in the present disclosure.

The three or more refocusing pulses may be applied after the RF excitation pulse, wherein each refocusing pulse may be configured to excite one or more spin echoes. The spin echo(es) excited by a refocusing pulse may include a symmetric spin echo and/or an asymmetric spin echo. Generally, the signal intensity of a plurality of spin echoes excited by a refocusing pulse may first increase and then decrease with time. Among the spin echoes excited by a refocusing pulse, the spin echo having the largest signal intensity may be referred to as a symmetric spin echo, and the remaining echo(es) may be referred to as asymmetric spin echo(es). In some embodiments, the one or more spin echoes excited by a refocusing pulse may include a symmetric spin echo and one or more asymmetric spin echoes. In some embodiments, the spin echo(es) excited by a refocusing pulse may merely include a symmetric spin echo.

In some embodiments, a same type or different types of spin echoes may be acquired after different refocusing pulses. For example, an asymmetric spin echo and a symmetric spin echo may be acquired after the first refocusing pulse, and only a symmetric spin echo may be acquired after each of the second refocusing pulse and third refocusing pulse. As another example, as shown in FIG. 7, the refocusing pulse 702 may excite a plurality of asymmetric spin echoes $S_{M+1}$ to $S_{2M}$ at $TE_{M+1}$ to $TE_{2M}$, respectively, and a symmetric spin echo $SE_1$ at $TE_{SE1}$. The refocusing pulse 703 may excite a plurality of asymmetric spin echoes $S_{2M+1}$ to $S_{3M}$ at $TE_{2M+1}$ to $TE_{3M}$, respectively, and a symmetric spin echo $SE_2$ at $TE_{SE2}$. The refocusing pulse 704 may excite a plurality of asymmetric spin echoes $S_{NM+1}$ to $S_{NM+N}$ at $TE_{NM+1}$ to $TE_{NM+N}$, respectively, and a symmetric spin echo $SE_N$ at $TE_{SEN}$.

In some embodiments, a plurality of symmetric spin echoes may be excited by the three or more refocusing pulses. The signal intensity of the symmetric spin echoes may undergo an exponential decay with a time constant T2. The plurality of symmetric spin echoes may be considered as T2-weighted spin echoes (or R2-weighted spin echoes).

In some embodiments, a plurality of asymmetric spin echoes may be excited by a refocusing pulse and acquired before a symmetric spin echo excited by the refocusing pulse. The signal intensity of the asymmetric spin echoes may undergo a T2 and T2* decay, and the asymmetric spin echoes may be considered as T2- and T2*-weighted spin echoes (or R2- and R2*-weighted spin echoes).

In some embodiments, an interval between the application of the RF excitation pulse and the application of the first refocusing pulse among the refocusing pulses may be equal to half of an interval between the application of two consecutive refocusing pluses among the plurality of refocusing pulses. For example, in the MRI pulse sequence 700 as shown in FIG. 7, an interval between the RF excitation pulse 701 and the refocusing pulse 702 may be equal to half of an interval between the refocusing pulse 702 and the refocusing pulse 703.

As described above, both the gradient echoes excited by the RF excitation pulse and the asymmetric spin echo(es) excited by the refocusing pulses may be T2- and T2*-weighted (or R2- and R2*-weighted) echoes, and the symmetric spin echo(es) excited by the refocusing pulses may be T2-weighted (or R2-weighted) echo(es). The gradient echoes and the asymmetric spin echo(es) may be used to determine information relating to the T2* relaxation of the subject (e.g., a T2* value, a T2* decay curve, or an R2* value). The symmetric spin echo(es) may be used to determine information relating to the T2 relaxation of the subject (e.g., a T2 value, a T2 decay curve, an R2 value). In some embodiments, a T2 decay curve may need to be determined based on three or more symmetric spin echoes. For example, each of the three or more refocusing pulses may be configured to excite a symmetric spin echo, and the three or more symmetric spin echoes may be used to determine the T2 decay curve. Optionally, the three or more symmetric spin echoes may be further used to determine an MWF value of the subject.

In some embodiments, the RF excitation pulse and the refocusing pulses of the MRI pulse sequence may form a gradient and spin echo (GRASE) pulse sequence, e.g., a 2D GRASE pulse sequence or a 3D GRASE pulse sequence. A GRASE may be a hybrid sequence that combines gradient and spin echo sequences and can be used to acquire both gradient echoes and spin echoes. For example, a GRASE pulse sequence may be implemented by a 90° RF excitation pulse followed by one or more 180° refocusing pulses. The GRASE imaging technique may have the characteristics of both the EPI technique and the fast spin-echo imaging technique, and be used to image the subject with fast speed and an improved imaging accuracy. For example, compared with the EPI imaging technique, the GRASE imaging technique may generate an image with fewer image artifacts and smaller deformation. In some embodiments, a 3D GRASE pulse sequence may be used to generate a 3D MWF image relating to the brain of the subject by scanning the brain within a short time (e.g., several minutes). The 3D GRASE pulse sequence may include one or more phase encoding lobes along the Z direction, a 90° slab-selective RF excitation pulse and one or more slab-selective refocusing pulses.

In some embodiments, the MRI pulse sequence may further include a crusher gradient including two lobes with the same polarity, wherein one of the two lobes may be applied before a refocusing pulse and the other one of the two lobes may be applied after the refocusing pulse. The crusher gradient may preserve a desired signal while eliminating or reducing an unwanted signal by manipulating the phase coherence of the transverse magnetization. The crusher gradient may be used to reduce or eliminate spurious echoes (e.g., stimulated echoes) and avoid artifacts in a resulting image.

In some embodiments, a partial Fourier k-space technique may be applied in the obtaining of the echo signals, so as to reduce the count of TEs (e.g., $TE_1$ to $TE_{SEN}$). In some embodiments, one or more techniques, such as a compressed sensing technique, a parallel imaging technique, a Cartesian k-space trajectory acquisition technique, a non-Cartesian k-space trajectory acquisition technique, or the like, or any combination thereof, may be applied during the MRI scan of the subject in order to increase the count of echo signals acquired in the scan and improve the data acquisition speed.

It should be noted that the MRI pulse sequence 700 is illustrated in FIG. 7 is merely provided for illustration, and not intended to be limiting. In some embodiments, one or more components of the MRI pulse sequence 700 described above may be omitted, and/or the MRI pulse sequence 700 may include one or more additional components. Merely by way of example, the fat suppression module may be omitted. The count of a component of the MRI pulse sequence 700 may be adjusted according to actual needs. For example, only one gradient echo may be excited by the RF excitation pulse 701. As another example, the count of the refocusing pulses may be equal to 1 or 2.

In 602, the processing device 120 (e.g., the quantitative measurement module 502) may perform a quantitative measurement on the subject based on the plurality of echo signals.

The quantitative measurement performed on the subject may include determining a quantitative parameter relating to the subject, generating a quantitative map of the subject (which includes a value of a quantitative parameter of each physical point of the subject), generating a specific image reflecting a physiological property of the subject, and/or any other measurement that can evaluate a characteristic of the subject. Exemplary quantitative parameters relating to the subject may include a T1, a T2, a T2*, an R2, an R2*, an R2', a B0 field, a pH, an MWF, an APT, or the like, or any combination thereof. Exemplary quantitative maps of the subject may include a T1 map, a T2 map, a T2* map, an R2 map, an R2* map, a B0 field distribution map, a pH map, an MWF map, an APT map, or the like, or any combination thereof. Exemplary images of the subject may include a T1-weighted image, a T2-weighted image, a T2*-weighted image, an R2-weighted image, an R2*-weighted image, or the like, or any combination thereof.

By applying the MRI pulse sequence as described in 601, more information relating to the subject may be acquired during the MRI scan of the subject, thereby achieving the acquisition of multiple quantitative parameters of the subject through a single acquisition. For example, information relating to R2, R2*, MWF, APT, and pH may be obtained through the single acquisition. As described elsewhere in the present disclosure, conventional CEST imaging methods usually need to perform multiple acquisitions to obtain a quantitative measurement result of multiple quantitative parameters. Through the process 600, the efficiency of medical imaging and disease diagnosis may be improved.

For illustration purposes, exemplary methods for performing quantitative measurement relating to a relaxation parameter (e.g., T1, T2, T2*, or T2'), MWF, APT, pH, and B0 of the brain of the subject are described hereinafter. It should be noted that this is not intended to be limiting. For persons having ordinary skills in the art, multiple variations and modifications may be made under the teachings of the present disclosure. For example, the echo signals acquired in operation 602 may be used to determine one or more other quantitative parameters.

In some embodiments, the processing device 120 may determine a relaxation parameter (e.g., T1, T2, T2*, or T2') relating to the brain of the subject to access a microenvironment in the brain. Generally, the value of a specific relaxation parameter of a physical point in the brain is within a certain range. If the value of the specific relaxation parameter is out of the certain range, the brain may be likely to have a pathological change. Measurement result relating to a relaxation parameter of the brain may be used to detect a pathological change and provide diagnostic information.

In some embodiments, the processing device 120 may determine an R2 value and an R2* value relating to the subject based on the plurality of echo signals obtained in 601. As described in 601, the gradient echoes excited by the RF excitation pulse may be R2*-weighted gradient echoes, the asymmetric spin echo(es) excited by the refocusing pulse(s) may be R2- and R2*-weighted spin echo(es), and the symmetric spin-echo(es) excited by the refocusing pulse(s) may be R2-weighted spin echo(es). Taking the MRI pulse sequence 700 as shown in FIG. 7 as an example, the gradient echoes $S_1$ to $S_M$ may be R2*-weighted gradient echoes, the asymmetric spin echoes $S_{M+1}$ to $S_{2M}$ excited by the first refocusing pulse may be R2- and R2*-weighted spin echoes. The gradient echoes $S_1$ to $S_M$ and the asymmetric spin echoes $S_{M+1}$ to $S_{2M}$ may be used to determine the R2* value and the R2 value. Merely by way of example, the R2* value and the R2 value may be determined according to Equation (1), as below:

$$SI(t) = \begin{cases} S_0^1 \cdot e^{-t \cdot R_2^*}, & 0 < t < \dfrac{TE_{SE}}{2} \\ S_0^2 \cdot e^{-TE_{SE} \cdot (R_2^* - R_2)} \cdot e^{-t \cdot (2 \cdot R_2 - R_2^*)}, & \dfrac{TE_{SE}}{2} < t < TE_{SE} \end{cases} \quad (1)$$

where t refers to an echo time, SW) refers to the signal intensity of an echo signal acquired at the echo time t, $S_0^1$ refers to the signal intensity of an initial signal that is used to model an exponential signal decay before the first refocusing pulse, $S_0^2$ refers to the signal intensity of an initial signal that is used to model an exponential signal decay after the first refocusing pulse. $S_0^1$ and $S_0^2$ may be equilibrium signals and different from each other.

In some embodiments, an echo signal acquired within the interval $$0 < t < \dfrac{TE_{SE}}{2}$$

may be a gradient echo, and an echo signal acquired within the interval $$\dfrac{TE_{SE}}{2} < t < TE_{SE}$$

may be an asymmetric spin echo. In other words, a gradient echo excited by the RF excitation pulse may be expressed as $S_0^1 \cdot e^{-t \cdot R_2^*}$, and an asymmetric spin echo excited by the first refocusing pulse may be expressed as $S_0^2 \cdot e^{-TE_{SE} \cdot (R_2^* - R_2)} \cdot e^{-t \cdot (2 \cdot R_2 - R_2^*)}$. In some embodiments, the values of $S_0^1$ and $S_0^2$, the R2 value, and the R2* value may be determined according to Equation (1) using a least square fitting algorithm. More descriptions regarding the determination of the R2 value and the R2* value may be found elsewhere in the present disclosure. See. e.g., FIGS. 11, 12 and relevant descriptions thereof.

In some embodiments, the processing device 120 may determine an R2' value relating to the subject based on the R2 value and the R2* value. The R2' value may be equal to a difference between the R2* value and the R2 value, that is, $R_2'=R_2^*-R_2$.

In some embodiments, the processing device 120 may determine a correction parameter δ relating to a slice profile-induced mismatch between the gradient echoes before the first refocusing pulse and the spin echoes after the first refocusing pulse. Normally, a combination of the RF excitation pulse and the refocusing pulse with nonideal slice profile characteristics may lead to the slice profile-induced mismatch. This slice profile-induced mismatch may cause a signal magnitude difference between the echo signals before and after the first refocusing pulse. The signal magnitude difference may increase as the slice profile-induced mismatch becomes more pronounced. To reduce or eliminate the effect of the signal magnitude difference, the correction parameter δ may be taken into consideration in the determination of the R2 value and R2* value and/or used to correct the R2 value and the R2* value. In some embodiments, the correction parameter δ may be determined according to Equation (1) through a least square fitting algorithm. In some embodiments, if a count of the obtained echo signals is greater than a threshold, the correction parameter δ may be determined as a ratio of $S_0^1$ and $S_0^2$, i.e., $$\delta = \frac{s_0^1}{s_0^2}.$$

In some embodiments, the processing device 120 may determine an MWF relating to the subject. Myelin is critical for healthy brain function, and an accurate measurement of the myelin may be important for understanding the brain plasticity and detecting a neurodegenerative disease. The MWF is a powerful quantitative parameter for accessing the myelin and other microstructure in the brain. For example, the MWF may be defined as a ratio of an area in the T2 distribution arising from myelin water to a total area of the entire T2 distribution. MWF may be visually presented as an MWF map. The MWF map may be generated through the MR imaging technique, which may be used to visualize myelination in the brain and the spinal cord in vivo.

In some embodiments, as described in connection with operation 601, the MRI pulse sequence may include three or more refocusing pulses, each of which may excite a symmetric spin echo. The symmetric spin echoes (e.g., the symmetric spin echoes $SE_1$, $SE_2$, ..., $SE_N$ as shown in FIG. 7) excited by the refocusing pulses may undergo an exponential decay with a time constant T2. The processing device 120 may determine an MWF relating to the subject based on the symmetric spin echoes excited by the at least three refocusing pulses. For example, the processing device 120 may determine a T2 decay curve based on the symmetric spin echoes (e.g., $SE_1$, $SE_2$, and $SE_3$) using, for example, a fitting algorithm (e.g., a Carr-Purcell-Meiboom-Gill (CPMG) or spin echo algorithm). The processing device 120 may further determine the MWF relating to the subject based on the T2 decay curve using a fitting algorithm (e.g., a non-negative least square (NNLS) algorithm). For example, the processing device 120 may construct an NNLS formula associated with the T2 decay and the MWF, and determine the MWF by solving the NNLS formula. The NNLS algorithm may eliminate or reduce the effect of a stimulated echo contamination, thereby improving the accuracy of the MWF. In some embodiments, the count of the symmetric spin echoes used in the determination of the T2 decay curve may be associated with the accuracy of the determined T2 decay curve. The count of the spin echoes used to determine the T2 decay curve may be determined according to a desired determination efficiency and a desired accuracy of the T2 decay curve. In some embodiments, the processing device 120 may determine the MWF of each physical point of the subject, and generate an MWF map that includes the MWF of each physical point of the subject.

In some embodiments, the processing device 120 may perform a quantitative measurement of an APT effect based on the echo signals acquired in operation 601. The quantification of the APT effect may be used in detecting mobile proteins and peptides in biological tissues, and detecting certain diseases. For example, in a tumor region, the concentration of proteins is elevated compared to surrounding tissues, and subsequently, the increased intracellular exchanges may lead to an increased APT level.

In some embodiments, a magnetization transfer asymmetry (MTRasym) analysis may be used to quantify the APT effect. For example, the MRI pulse sequence may be applied to the subject multiple times with different saturation frequencies of the CEST module in a plurality of acquisitions. The plurality of echo signals acquired in operation 601 may include a plurality of sets of echo signals, wherein each set of echo signals may be acquired in one of the plurality of acquisitions with a CEST module having a specific saturation frequency. The saturation frequency of a CEST module refers to the saturation frequency of an RF saturation pulse of the CEST module. For example, the MRI pulse sequence may be applied to the subject 31 times with different saturation frequencies of the CEST module. The saturation frequencies may be within a range from +4.5 part per million (ppm) to −4.5 ppm. Merely by way of example, the saturation frequencies may include +4.5 ppm, +4.2 ppm, +3.9 ppm, 0 ppm, ..., −3.9 ppm, −4.2 ppm, −4.5 ppm. In some embodiments, the CEST module having a saturation frequency of 0 ppm may be used to acquire a set of echo signals without RF saturation.

Figure 13A:
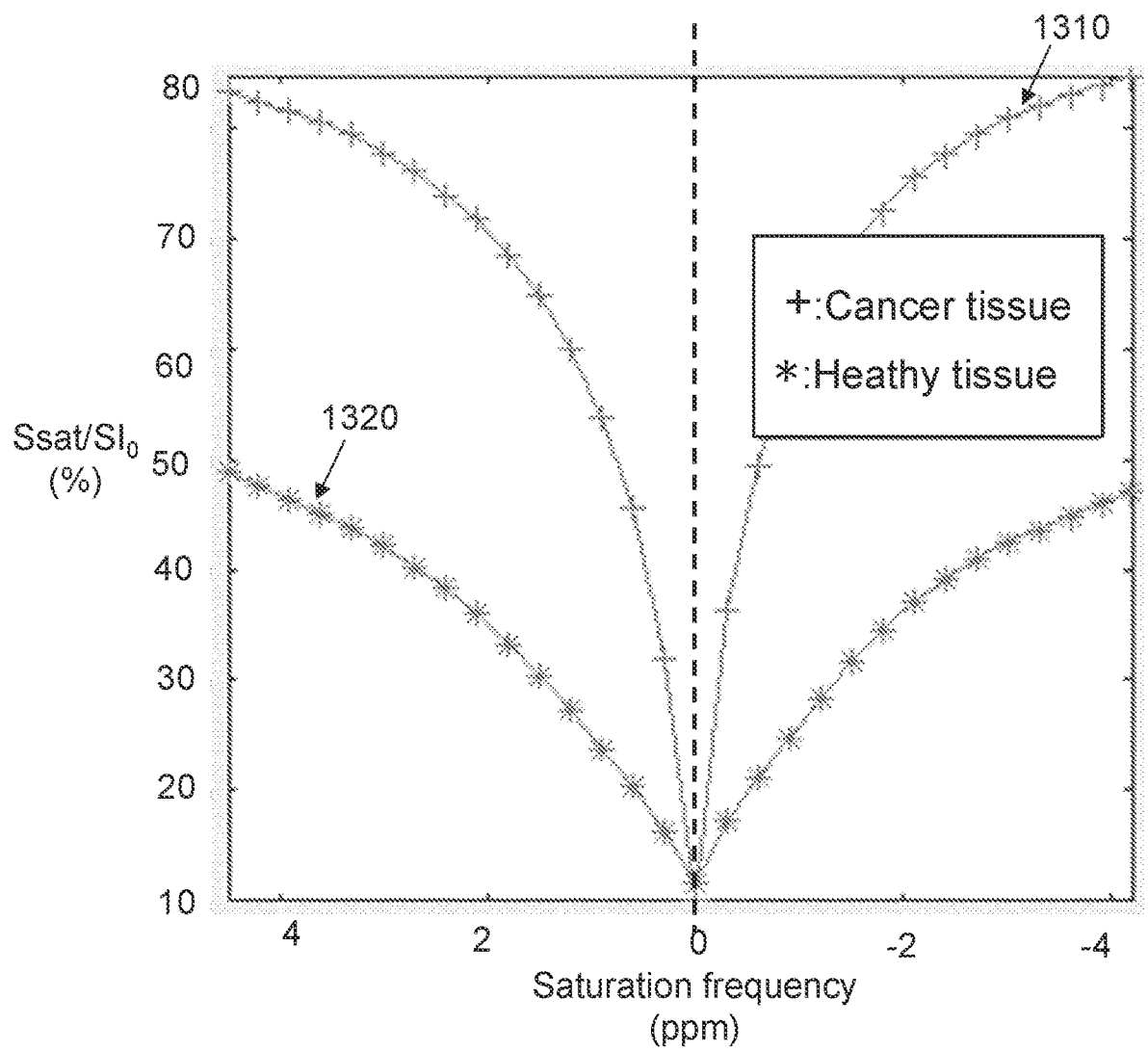
FIGS. 13A-13C are schematic diagrams illustrating exemplary z-spectra of a cancer tissue and a healthy tissue of the subject according to some embodiments of the present disclosure.
Figure 13B:
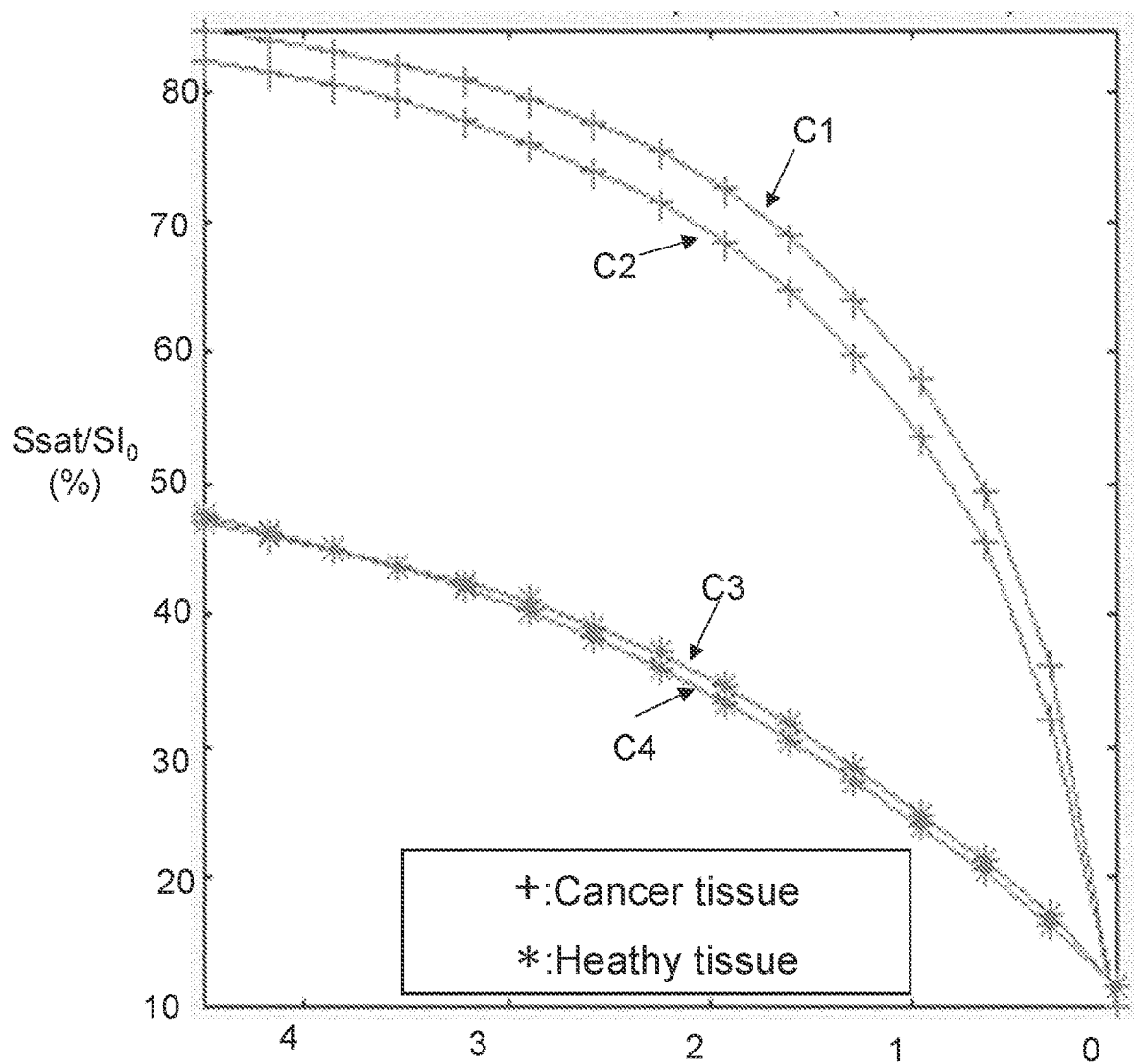
Figure 13C:
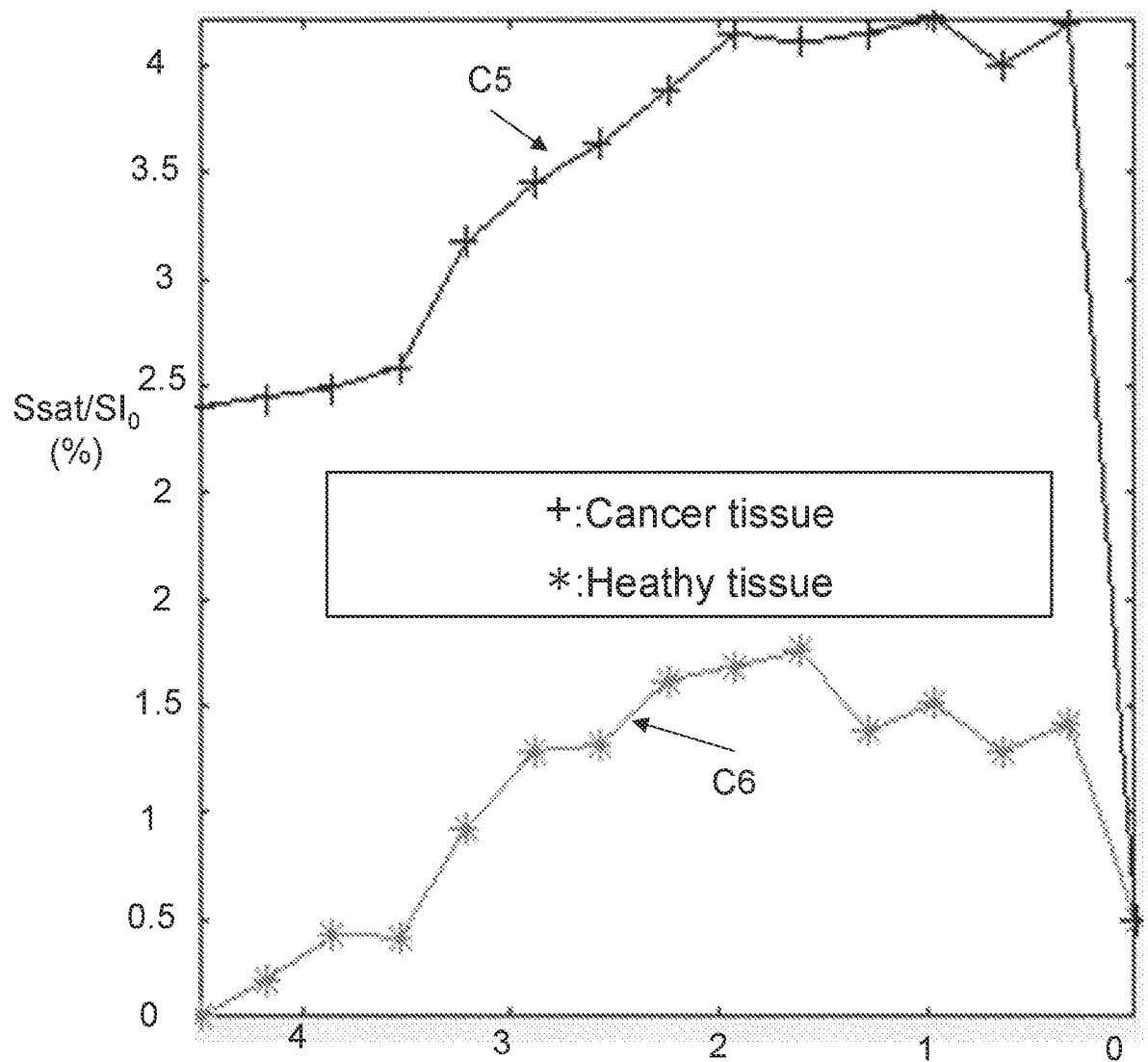

In some embodiments, an RF saturation effect on water in tissue may be plotted as a function of a saturation frequency offset relative to water (i.e., a z-spectrum). Ideally, the entire z-spectrum may be substantially symmetric with respect to 0 ppm. Merely by way of example, it is assumed that the subject includes a cancer tissue and a healthy tissue. As shown in FIGS. 13A to 13C, the horizontal axis represents the saturation frequency of the RF saturation pulse, and the vertical axis represents a ratio of $S_{sat}$ to $SI_0$. $S_{sat}$ refers to a signal intensity measured with RF saturation, for example, excited by an MRI pulse sequence including both a CEST module and a fat suppression module. $SI_0$ refers to a signal intensity measured without RF saturation, for example, applied by an MRI pulse sequence including the fat suppression module without the CEST module (i.e., a CEST with 0 ppm). In FIG. 13A, a curve 1310 marked with "+" may correspond to the cancer tissue, and a curve 1320 marked with "*" may correspond to the healthy tissue. FIG. 13B was generated by folding the curves 1310 and 1320 along the dotted line corresponding 0 ppm. In FIG. 13B, a curve C1 corresponds to part of the curve 1310 in the range from 0 ppm to +4.5, a curve C2 corresponds to part of the curve 1310 in the range from −4.5 ppm to 0 ppm, a curve C3 corresponds to part of the curve 1320 in the range from 0 ppm to +4.5, and a curve C4 corresponds to part of the curve 1320 in the range from −4.5 ppm to 0 ppm. The processing device 120 may further generate a curve C5 by determining a difference between the curves C1 and C2, and generate a curve C6 by determining a difference between the curves C3 and C4. As shown in FIG. 13C, at a same saturation frequency level, the difference value corresponding to the cancer tissue in the curve C5 is higher than the difference value corresponding to the healthy tissue in the curve c6. By analyzing the z-spectrum of a tissue, the processing device 120 may determine whether the tissue is a cancer tissue or a healthy tissue.

In some embodiments, the processing device 120 may perform the MTRasym analysis according to Equation (2) as below:

$$MTR_{asym}(\omega) = \frac{S(-\omega) - S(\omega)}{SI_0},\quad \text{Equation (2)}$$

where $\omega$ and $-\omega$ refer to saturation frequencies, $S(\omega)$ refers to the signal intensity of an echo signal of bulk water when a CEST module with the saturation frequency $\omega$ is applied, $S(-w)$ refers to the signal intensity of an echo signal of bulk water when a CEST module with the saturation frequency $-\omega$ is applied, and $SI_0$ refers to the signal intensity of an echo signal of bulk water when no RF saturation is applied. The introduction of $SI_0$ may be used to reduce or eliminate the effect of a magnetization transfer and a direct water saturation.

In some embodiments, the processing device 120 may determine a pH value relating to the subject. pH information of the subject may serve as a basis for detecting some diseases, such as a stroke, a kidney failure, a tumor. For example, acidosis may be caused by various diseases. A quick and accurate detection of an acid-base change of a tissue may have scientific significance and clinical value for early detection and evaluation of a disease. Merely by way of example, an extracellular pH of a normal cell may be around 7.4, and an intracellular pH of the normal cell may be around 7.3. An extracellular pH of a tumor cell may be 6.0 to 7.0, and an intracellular pH of the tumor cell may be greater than 7.4. The pH value of a cell may be used to detect a tumor.

In some embodiments, the processing device 120 may determine a pH value relating to the subject using one or more techniques for PH measurement, such as a water proton nuclear magnetic resonance (NMR) via CEST with selected chemical exchange sites technique, an amine and amide concentration-independent detection (AACID) technique, a water-exchange spectroscopy (WEX) technique, or the like. In some embodiments, the processing device 120 may determine a pH value according to Equation (3), as below:

$$k_b = k_0 + k_{base} * 10^{-(14-pH)},\quad \text{Equation (3)}$$

wherein $k_0$ refers to a default exchange rate, $k_b$ refers to an exchange rate between amine protons and bulk water protons, and $k_{base}$ refers to a base-catalyzed exchange rate constant.

In some embodiments, $k_b$ may be associated with a result of the MTRasym analysis as aforementioned. For example, $k_b$ may be determined according to Equation (4) as below:

$$k_b = \frac{R_{1W}}{fs \cdot \left[\frac{\alpha \cdot (1-\sigma)}{MTR_{asym}(\omega) - \Delta MTR'_{asym}(\omega)} - 1\right]},\quad \text{Equation (4)}$$

wherein $R_{1W}$ refers to a longitudinal relaxation rate of water, $\alpha$ refers to a saturation efficiency, a refers to an overflow element, $f_s$ refers to a molality ratio of exchangeable protons, and $\Delta MTR'_{asym}(\omega)$ refers to a change in a signal caused by a magnetization transfer (MT) effect. Based on Equations (3) and (4), the pH value may be determined.

In some embodiments, the processing device 120 may generate a B0 map based on the plurality of echo signals or a portion of the echo signals (e.g., any two echo signals with different TEs). For example, the processing device 120 may generate the B0 map using a water saturation shift referencing (WASSR) method. Optionally, the processing device 120 may use the B0 map to correct one or more other quantitative parameters relating to the subject, such as APT.

Generally, an accurate and efficient disease diagnosis may need various information for comprehensive judgment. Different quantitative parameters, quantitative maps, and images may provide different medical information, for example, anatomical information, acid-base balance information, metabolite information, blood flow and blood vessel information, brain function information, cardiac function information, or the like, or any combination thereof. The MRI pulse sequence used in the present disclosure may be used to acquire information relating to various quantitative parameters (e.g., R2, R2*, MWF, APT, and pH) simultaneously and efferently. This may improve the efficiency of diseases diagnose. In addition, in some embodiments, a B0 correction may be performed to improve the accuracy of the measurement result.

It should be noted that the above description regarding the process 600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 600 may be accomplished with one or more additional operations not described and/or without one or more of the operations discussed above. For example, the process 600 may further include an operation to send a quantitative measurement result to a terminal 140 for display.

Figure 9:
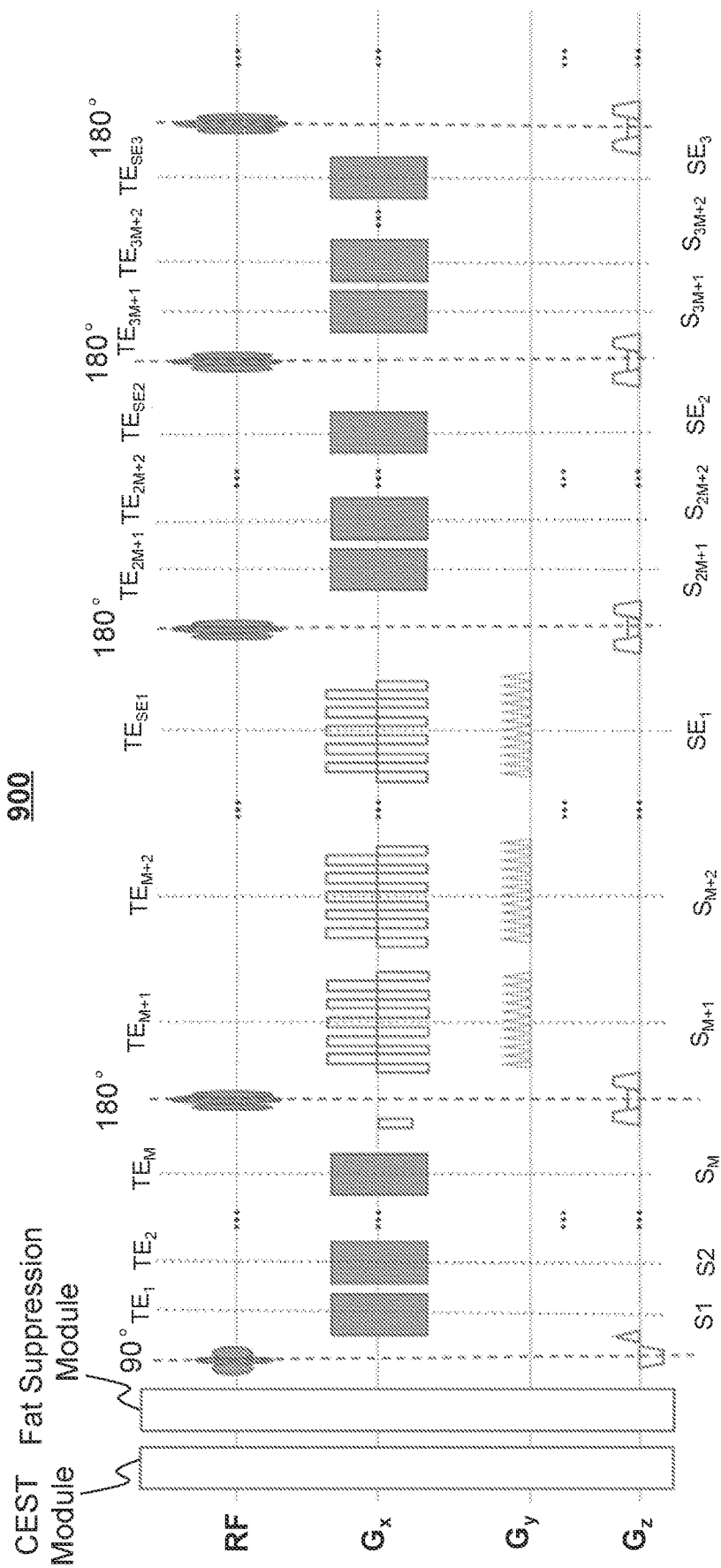
FIG. 9 is a schematic diagram illustrating an exemplary GRASE pulse sequence according to some embodiments of the present disclosure.

FIG. 9 is a schematic diagram illustrating an exemplary GRASE pulse sequence 900 according to some embodiments of the present disclosure. The GRASE pulse sequence 900 may be an exemplary embodiment of the MRI pulse sequence 700 as illustrated in FIG. 7. As shown in FIG. 9, the GRASE pulse sequence 900 may include a CEST module, a fat suppression module, a 90° RF excitation pulse, and three or more 180° refocusing pulses. The 90° RF excitation pulse of the GRASE pulse sequence 900 may excite a plurality of gradient echoes $S_1$ to $S_M$ at $TE_1$ to $TE_M$, respectively. The first 180° refocusing pulse of the GRASE pulse sequence 900 may excite two or more asymmetric spin echoes including $S_{M+1}$ at $TE_{M+1}$ and $S_{M+2}$ at $TE_{M+2}$, and a symmetric spin echo $SE_1$ at $TE_{SE1}$. The second 180° refocusing pulse of the GRASE pulse sequence 900 may excite two or more asymmetric spin echoes including $S_{2M+1}$ at $TE_{2M+1}$ and $S_{2M+2}$ at $TE_{2M+2}$, and a symmetric spin echo $SE_2$ at $TE_{SE2}$. The third 180° refocusing pulse of the GRASE pulse sequence 900 may excite two or more asymmetric spin echoes including $S_{3M+1}$ at $TE_{3M+1}$ and $S_{3M+2}$ at $TE_{3M+2}$, and a symmetric spin echo $SE_3$ at $TE_{SE3}$.

Figure 10:
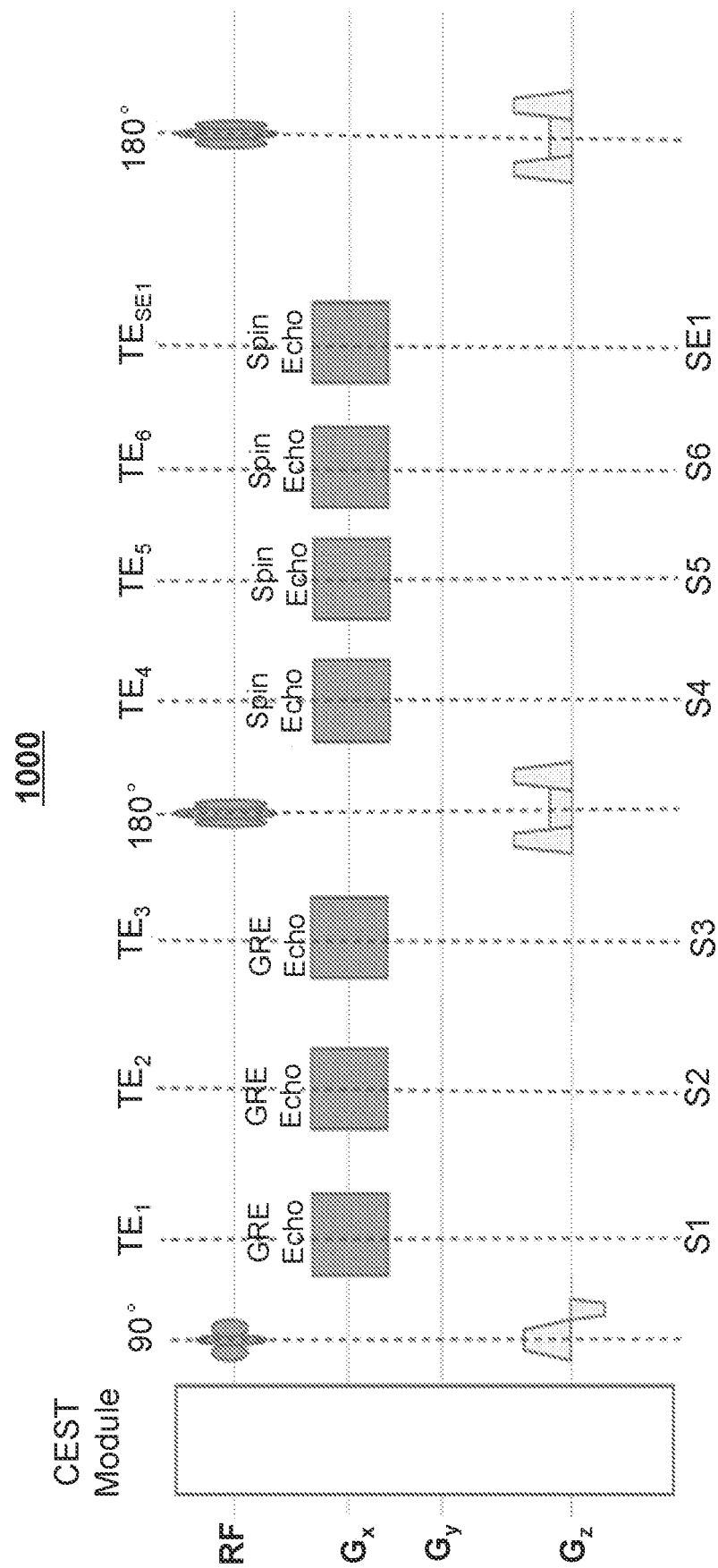
FIG. 10 is a schematic diagram illustrating an exemplary GRASE pulse sequence according to some embodiments of the present disclosure.

FIG. 10 is a schematic diagram illustrating an exemplary GRASE pulse sequence 1000 according to some embodiments of the present disclosure. The GRASE pulse sequence 1000 may be another exemplary embodiment of the MRI pulse sequence 700 as illustrated in FIG. 7. As shown in FIG. 10, the GRASE pulse sequence 1000 may include a CEST module, a 90° RF excitation pulse, and by two 180° refocusing pulses. The 90° RF excitation pulse of the GRASE pulse sequence 1000 may excite three gradient echoes $S_1$ to $S_3$ at $TE_1$ to $TE_3$, respectively. The first 180° refocusing pulse of the GRASE pulse sequence 1000 may excite three asymmetric spin echoes $S_4$ and $S_5$ at $TE_4$ to $TE_6$, and a symmetric spin echo $SE_1$ at $TE_{SE1}$.

Figure 11:
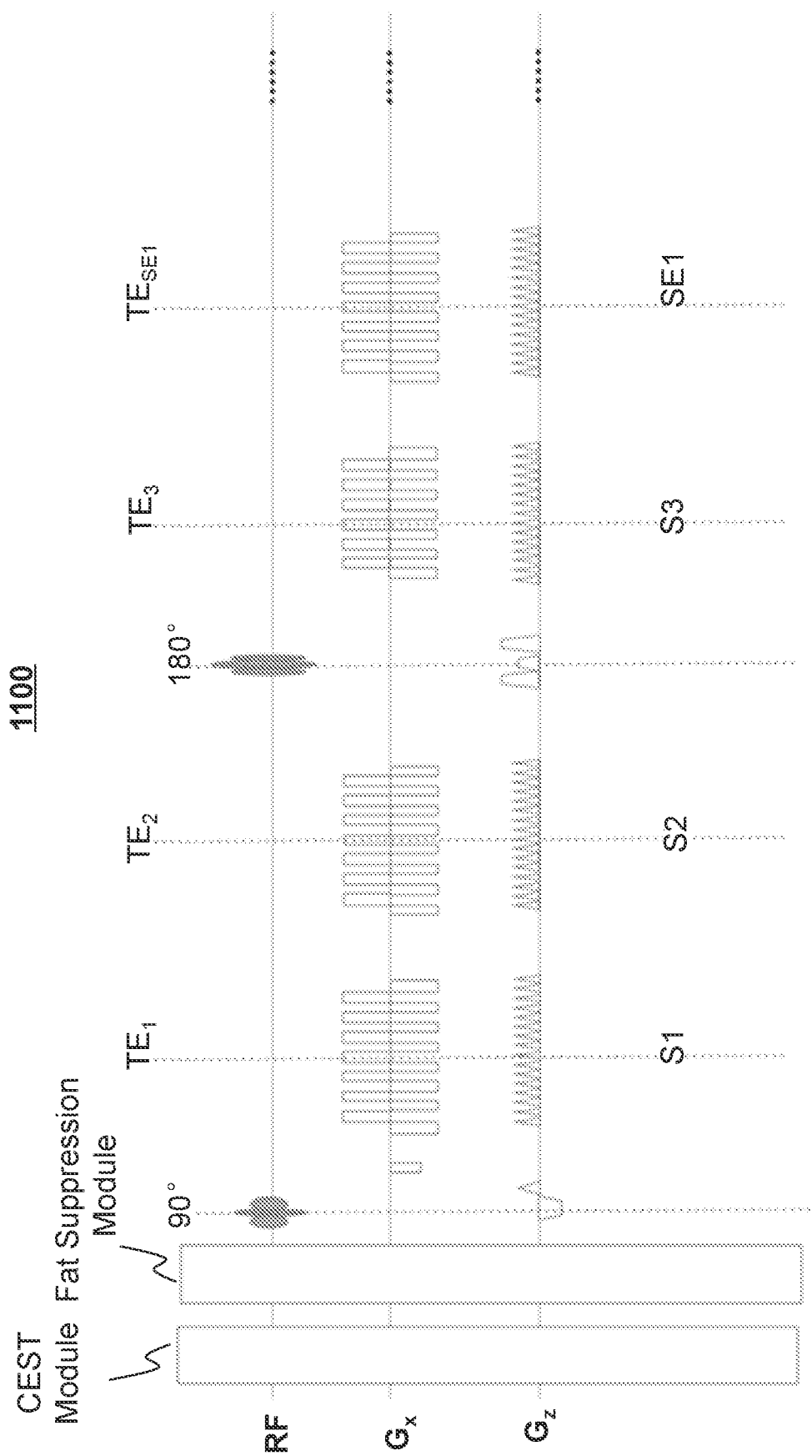
FIG. 11 is a schematic diagram illustrating an exemplary GRASE pulse sequence according to some embodiments of the present disclosure.

FIG. 11 is a schematic diagram illustrating an exemplary GRASE pulse sequence 1100 according to some embodiments of the present disclosure. The GRASE pulse sequence 1100 may be another exemplary embodiment of the MRI pulse sequence 700 as illustrated in FIG. 7. As shown in FIG. 11, the GRASE pulse sequence 1100 may include a CEST module, a fat suppression module, a 90° RF excitation pulse, and a 180° refocusing pulse. The 90° RF excitation pulse of the GRASE pulse sequence 1100 may excite a gradient echo $S_1$ at $TE_1$ and a gradient echo $S_2$ at $TE_2$. The 180° refocusing pulse of the GRASE pulse sequence 1100 may excite an asymmetric spin echoes $S_3$ at $TE_3$ and a symmetric spin echo $SE_1$ (also denoted as $S_4$) at $TE_{SE1}$ (also denoted as $TE_4$).

The processing device 120 may determine an R2 value, an R2* value, and an R2' value relating to the subject based on the echo signals $S_1$-$S_4$. For example, the signal intensity (or amplitude) of the echo signals $S_1$-$S_4$ may be represented as Equations (5) to (8), respectively, as below:

$$SI_1 = S(TE_1) = S_0^1 \cdot e^{-TE_1 R_2^*}, \quad \text{Equation (5)}$$

$$SI_2 = S(TE_2) = S_0^1 \cdot e^{-TE_S R_2^*}, \quad \text{Equation (6)}$$

$$SI_3 = S(TE_3) = S_0^2 \cdot e^{(-TE_4 + TE_3) \cdot R_2^* \cdot (TE_4 - 2 \cdot TE_3) \cdot R_2}, \quad \text{Equation (7)}$$

$$SI_4 = S(TE_4) = S_0^2 \cdot e^{-TE_4 \cdot R_2}, \quad \text{Equation (8)}$$

where $SI_n$ (n=1, 2, 3, 4) represent the signal intensity of the echo signal Sn.

The R2 value and the R2* value relating to the subject may be determined according to Equation (9) as below:

$$A = B^{-1}S, \text{ where} \quad (9)$$

$$A = \begin{pmatrix} \ln(SI_0) \\ \ln(\delta) \\ \ln(R_2^*) \\ \ln(R_2) \end{pmatrix}, B = \begin{pmatrix} 1 & 0 & -TE_1 & 0 \\ 1 & 0 & -TE_2 & 0 \\ 1 & -1 & -TE_4+TE_3 & TE_4-2 \cdot TE_3 \\ 1 & -1 & 0 & -TE_4 \end{pmatrix},$$

$$S = \begin{pmatrix} \ln(SI_1) \\ \ln(SI_2) \\ \ln(SI_3) \\ \ln(SI_4) \end{pmatrix},$$

$SI_0$ refers to a signal intensity measured without RF saturation as described in 602, and $\delta$ represents the correction parameter relating to a slice profile-induced mismatch as described in 602.

The R2 value and the R2* value may be determined according to Equations (5)-(9). The R' value relating to the subject may be determined according to Equation (10) as below:

$$R_2' = R_2^* - R_2. \quad (10)$$

In some embodiments, the processing device 120 may determine the R2 value of each physical point of the subject, and generate an R2 map that includes the R2 value of each physical point of the subject. Additionally or alternatively, the processing device 120 may determine the R2* value of each physical point of the subject, and generate an R2* map that includes the R2* value of each physical point of the subject. Additionally or alternatively, the processing device 120 may determine the R2' value of each physical point of the subject, and generate an R2' map that includes the R2' value of each physical point of the subject.

Figure 12:
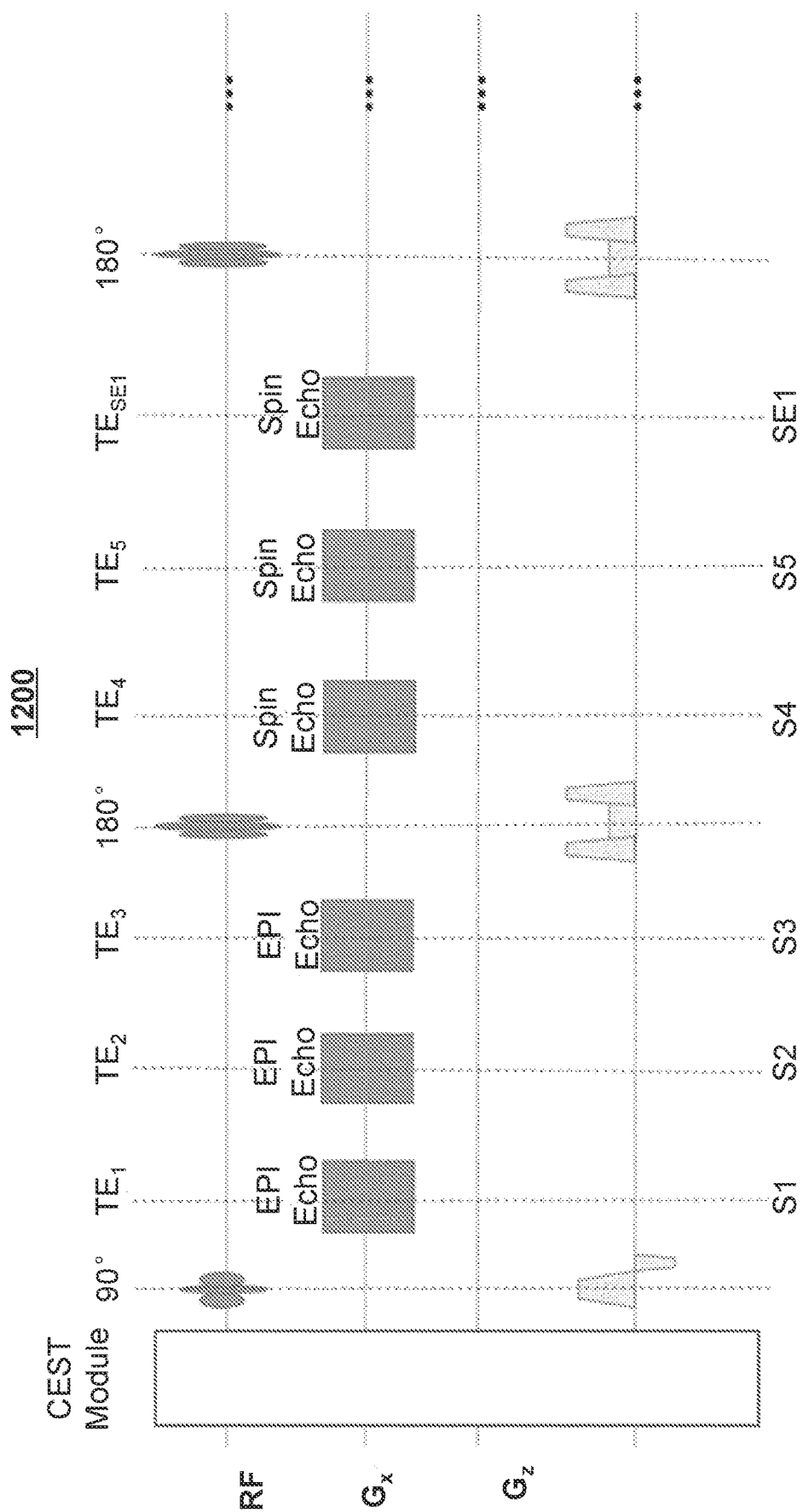
FIG. 12 is a schematic diagram illustrating an exemplary GRASE pulse sequence according to some embodiments of the present disclosure.

FIG. 12 is a schematic diagram illustrating an exemplary GRASE pulse sequence 1200 according to some embodiments of the present disclosure. The GRASE pulse sequence 1200 may be another exemplary embodiment of the MRI pulse sequence 700 as illustrated in FIG. 7. As shown in FIG. 12, the GRASE pulse sequence 1200 may include a CEST module, a 90° RF excitation pulse, and two 180° refocusing pulses. The 90° RF excitation pulse of the GRASE pulse sequence 1200 may excite three gradient echoes $S_1$, $S_2$, and $S_3$ at $TE_1$, $TE_2$, and $TE_3$. The first 180° refocusing pulse of the GRASE pulse sequence 1200 may excite two asymmetric spin echoes $S_4$ and $S_5$ at $TE_4$ and $TE_5$, and a symmetric spin echo $SE_1$ (also denoted as $S_6$) at $TE_{SE1}$ (also denoted as $TE_6$)

The processing device 120 may determine an R2 value, an R2* value, and an R2' value relating to the subject based on the echo signals $S_1$-$S_6$. For example, the signal intensity (or amplitude) of the echo signals $S_1$-$S_6$ may be represented as Equations (11) to (16), respectively, as below:

$$SI_1 = S(TE_1) = S_0^1 \cdot e^{-TE_1 \cdot R_2^\S}, \quad (11)$$

$$SI_2 = S(TE_2) = S_0^1 \cdot e^{-TE_2 \cdot R_2^*}, \quad (12)$$

$$SI_3 = S(TE_3) = S_0^1 \cdot e^{-TE_3 \cdot R_2^*}, \quad (13)$$

$$SI_4 = S(TE_4) = S_0^2 \cdot e^{(TE_4-TE_6)} \cdot e^{(TE_6 - 2 \cdot TE_4) \cdot R_2}, \quad (14),$$

$$SI_5 = S(TE_5) = S_0^2 \cdot e^{(TE_5-TE_6) \cdot R_2^*} \cdot e^{(TE_6 - 2 \cdot TE_5) \cdot R_2}, \quad (15)$$

$$SI_6 = S(TE_6) = S_0^2 \cdot e^{-TE_6 \cdot R_2}, \quad (16)$$

where $SI_n$ (n=1, 2, ..., 6) represent the signal intensity of the echo signal Sn.

The R2 value and the R2* value relating to the subject may be determined according to Equation (17) as below:

$$A = B^{-1}S, \text{ where} \quad (17)$$

$$A = \begin{pmatrix} \ln(SI_0) \\ 0 \\ 0 \\ \ln(\delta) \\ \ln(R_2^*) \\ \ln(R_2) \end{pmatrix}, B = \begin{pmatrix} 1 & 0 & 0 & 0 & -TE_1 & 0 \\ 1 & 0 & 0 & 0 & -TE_2 & 0 \\ 1 & 0 & 0 & 0 & -TE_3 & 0 \\ 1 & 0 & 0 & -1 & TE_4-TE_6 & TE_6-2 \cdot TE_4 \\ 1 & 0 & 0 & -1 & TE_5-TE_6 & TE_6-2 \cdot TE_5 \\ 1 & 0 & 0 & -1 & 0 & -TE_6 \end{pmatrix},$$

$$\text{and } S = \begin{pmatrix} \ln(SI_1) \\ \ln(SI_2) \\ \ln(SI_3) \\ \ln(SI_4) \\ \ln(SI_5) \\ \ln(SI_6) \end{pmatrix}.$$

In some embodiments, the R2 value and the R2* value relating to the subject may be determined without the echo signals $S_3$ and $S_4$, wherein $$A = \begin{pmatrix} \ln(SI_0) \\ \ln(\delta) \\ \ln(R_2^*) \\ \ln(R_2) \end{pmatrix}, B = \begin{pmatrix} 1 & 0 & -TE_1 & 0 \\ 1 & 0 & -TE_2 & 0 \\ 1 & -1 & TE_5 - TE_6 & TE_6 - 2 \cdot TE_5 \\ 1 & -1 & 0 & -TE_6 \end{pmatrix},$$

$$S = \begin{pmatrix} \ln(SI_1) \\ \ln(SI_2) \\ \ln(SI_5) \\ \ln(SI_6) \end{pmatrix}.$$

The R2 value and the R2* value may be determined according to Equations (11)-(17). The corresponding R' value relating to the subject may be determined according to Equation (10). Similar to the embodiment as described in connection with FIG. 11, the processing device 120 may generate an R2 map, an R2* map, and/or an R2' map relating to the subject.

It should be noted that the above exemplary pulse sequences illustrated in FIGS. 9-12 and the descriptions thereof are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, a GRASE pulse sequence may include a rewinding gradient applied along a slice-encoding direction after a readout of an echo signal, so as to eliminate or reduce an effect of a phase modulation gradient applied in an acquisition step for spatial encoding along a phase-encoding direction. Moreover, the Equations provided above are illustrative examples and can be modified in various ways.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±1%, ±5%, ±10%, or ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for magnetic resonance imaging (MRI), comprising:
at least one non-transitory computer readable medium including a set of instructions; and
at least one processor configured to communicate with the at least one non- transitory computer readable medium, wherein when executing the set of instructions, the at least one processor is configured to direct the system to perform operations including:
obtaining a plurality of echo signals relating to a subject, the plurality of echo signals being excited by an MRI pulse sequence applied to the subject; and
simultaneously performing a relaxation parameter measurement and an amide proton transfer (APT) measurement on the subject based on the plurality of echo signals; and
sending a quantitative measurement result of the relaxation parameter measurement and the APT measurement to a terminal for display, wherein the MRI pulse sequence comprises:
a chemical exchange and saturation transfer (CEST) module configured to selectively excite exchangeable protons or exchangeable molecules in the subject; and
a gradient and spin echo (GRASE) pulse sequence configured to excite a plurality of gradient echoes and a plurality of spin echoes.

2. A method for magnetic resonance imaging (MRI), comprising:
obtaining a plurality of echo signals relating to a subject, the plurality of echo signals being excited by an MRI pulse sequence applied to the subject; and
simultaneously performing a relaxation parameter measurement and an amide proton transfer (APT) measurement on the subject based on the plurality of echo signals; and
sending a quantitative measurement result of the relaxation parameter measurement and the APT measurement to a terminal for display, wherein the MRI pulse sequence comprises:
a chemical exchange and saturation transfer (CEST) module configured to selectively excite exchangeable protons or exchangeable molecules in the subject; and
a gradient and spin echo (GRASE) pulse sequence configured to excite a plurality of gradient echoes and a plurality of spin echoes.

3. A non-transitory computer readable medium, comprising at least one set of instructions for magnetic resonance imaging (MRI), wherein when executed by at least one processor, the at least one set of instructions directs the at least one processor to perform a method, the method comprising:
obtaining a plurality of echo signals relating to a subject, the plurality of echo signals being excited by an MRI pulse sequence applied to the subject; and
simultaneously performing a relaxation parameter measurement and an amide proton transfer (APT) measurement on the subject based on the plurality of echo signals; and
sending a quantitative measurement result of the relaxation parameter measurement and the APT measurement to a terminal for display, wherein the MRI pulse sequence comprises:
a chemical exchange and saturation transfer (CEST) module configured to selectively excite exchangeable protons or exchangeable molecules in the subject; and
a gradient and spin echo (GRASE) pulse sequence configured to excite a plurality of gradient echoes and a plurality of spin echoes.

4. The system of claim 1, wherein the relaxation parameter measurement and the APT measurement are simultaneously performed on the subject based on echo signals acquired through a single acquisition.

5. The system of claim 1, wherein the GRASE pulse sequence includes:
a radio frequency (RF) pulse applied after the CEST module configured to excite the plurality of gradient echoes; and
one or more refocusing pulses applied after the RF pulse, wherein each of the one or more refocusing pulses is configured to excite one or more of the plurality of spin echoes.

6. The system of claim 5, wherein the one or more refocusing pulses comprise at least three refocusing pulses.

7. The system of claim 6, wherein the one or more spin echoes excited by each of the at least three refocusing pulses comprise a symmetric spin echo, and a Myelin water fraction (MWF) measurement is performed simultaneously with the relaxation parameter measurement and an amide proton transfer (APT) measurement based on the plurality of echo signals by:
determining an MWF relating to the subject based on the symmetric spin echoes excited by the at least three refocusing pulses.

8. The system of claim 5, wherein the one or more spin echoes excited by at least one of the one or more refocusing pulses comprise a symmetric spin echo and one or more asymmetric spin echoes.

9. The system of claim 8, wherein the relaxation parameter measurement comprises:
determining an R2 value and an R2* value relating to the subject based on the plurality of gradient echoes, the one or more asymmetric spin echoes excited by the at least one refocusing pulse, and the symmetric spin echo excited by the at least one refocusing pulse.

10. The system of claim 9, wherein the relaxation parameter measurement further comprises:
determining an R2' value relating to the subject based on the R2 value and the R2* value.

11. The system of claim 8, wherein the at least one processor is further configured to direct the system to perform the operations including:
determining a coefficient that measures a difference between a slice profile corresponding to the RF excitation pulse and a slice profile corresponding to the at least one refocusing pulse based on the plurality of gradient echoes, the one or more asymmetric spin echoes excited by the at least one refocusing pulse, and the symmetric spin echo excited by the at least one refocusing pulse.

12. The system of claim 8, wherein
the plurality of gradient echoes are R2*-weighted gradient echoes,
the one or more asymmetric spin echoes excited by the at least one refocusing pulse are R2- and R2*-weighted spin echoes, and
the symmetric spin echo excited by the at least one refocusing pulse is an R2-weighted spin echo.

13. The system of claim 8, wherein the performing a relaxation parameter measurement includes determining information relating to T2* relaxation based on the plurality of gradient echoes and the one or more asymmetric spin echoes.

14. The system of claim 5, wherein the MRI pulse sequence further comprises a fat suppression module applied between the CEST module and the RF excitation pulse configured to suppress signals from an adipose tissue of the subject.

15. The system of claim 5, wherein
the MRI pulse sequence is applied to the subject for multiple times with different saturation frequencies of the CEST module in a plurality of acquisitions,
the plurality of echo signals comprise a plurality of sets of echo signals each of which are acquired in one of the plurality of acquisitions, and
the amide proton transfer (APT) measurement comprises:
performing a magnetization transfer asymmetry (MTRasym) analysis on the plurality of sets of echo signals.

16. The system of claim 15, wherein the at least one processor is further configured to direct the system to perform the operations including:
determining a pH value relating to the subject based on a result of the MTRasym analysis.

17. The system of claim 1, the at least one processor is further configured to direct the system to perform the operations including:
generating a B0 map based on the plurality of echo signals.

18. The method of claim 2, wherein the GRASE pulse sequence includes:
a radio frequency (RF) pulse applied after the CEST module configured to excite the plurality of gradient echoes; and
one or more refocusing pulses applied after the RF pulse, wherein each of the one or more refocusing pulses is configured to excite one or more of the plurality of spin echoes.

19. The method of claim 18, wherein the one or more refocusing pulses comprise at least three refocusing pulses,
the one or more spin echoes excited by each of the at least three refocusing pulses comprise a symmetric spin echo, and
a Myelin water fraction (MWF) measurement is performed simultaneously with the relaxation parameter measurement and an amide proton transfer (APT) measurement based on the plurality of echo signals by:
determining an MWF relating to the subject based on the symmetric spin echoes excited by the at least three refocusing pulses.

20. The method of claim 2, wherein
the MRI pulse sequence is applied to the subject for multiple times with different saturation frequencies of the CEST module in a plurality of acquisitions,
the plurality of echo signals comprise a plurality of sets of echo signals each of which are acquired in one of the plurality of acquisitions, and
the amide proton transfer (APT) measurement comprises:
performing a magnetization transfer asymmetry (MTRasym) analysis on the plurality of sets of echo signals.

* * * * *